(12) United States Patent
Chen

(10) Patent No.: US 9,885,781 B2
(45) Date of Patent: *Feb. 6, 2018

(54) DETECTOR GENERATING A DISPLACEMENT SIGNAL BY INJECTION LOCKING AND INJECTION PULLING

(71) Applicant: RichWave Technology Corp., Taipei (TW)

(72) Inventor: Tse-Peng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/415,832

(22) Filed: Jan. 25, 2017

(65) Prior Publication Data

US 2017/0131391 A1    May 11, 2017

Related U.S. Application Data

(63) Continuation-in-part of application No. 15/076,685, filed on Mar. 22, 2016, now Pat. No. 9,590,671.

(30) Foreign Application Priority Data

Apr. 8, 2015 (TW) .............................. 104111323 A

(51) Int. Cl.
*H04B 1/38* (2015.01)
*H04L 5/16* (2006.01)
(Continued)

(52) U.S. Cl.
CPC ................. *G01S 11/10* (2013.01); *G01S 7/35* (2013.01); *G01S 13/536* (2013.01); *H03B 19/14* (2013.01);
(Continued)

(58) Field of Classification Search
CPC . G01S 11/10; G01S 7/034; G01S 7/35; G01S 13/536; H04B 1/10; H04L 1/0053;
(Continued)

(56) References Cited

U.S. PATENT DOCUMENTS 6,360,087 B1    3/2002  Rozenblit
9,590,671 B2 *  3/2017  Chen ........................ H04B 1/10
(Continued)

FOREIGN PATENT DOCUMENTS

EP      1 339 165 A1    8/2003
JP      2014168220      9/2014
(Continued)

*Primary Examiner* — Phuong Phu
(74) *Attorney, Agent, or Firm* — Winston Hsu

(57) ABSTRACT

A detector includes a frequency multiplier and a transceiving node. The frequency multiplier includes a first terminal, a second terminal and an output terminal. The first terminal is used to receive a first injection signal having a first frequency. The output terminal is used to output an output signal. The second terminal is used to receive a second injection signal having a second frequency. The frequency multiplier is used to output the output signal at a frequency substantially equal to a multiple of the first frequency by injection locking and pull the output signal to the second frequency by injection pulling. The transceiving node is coupled to the output terminal and the second terminal of the frequency multiplier. The transceiving node is used to transmit the output signal, and receive a received signal having a third frequency. The received signal is used to update the second injection signal.

19 Claims, 17 Drawing Sheets

(51) Int. Cl.
*G01S 11/10* (2006.01)
*G01S 7/35* (2006.01)
*G01S 13/536* (2006.01)
*H03B 19/14* (2006.01)
*H03L 7/08* (2006.01)
*H03L 7/099* (2006.01)
*H04L 1/00* (2006.01)
*G01S 7/03* (2006.01)

(52) U.S. Cl.
CPC ............ *H03L 7/0802* (2013.01); *H03L 7/099* (2013.01); *H04L 1/0053* (2013.01); *G01S 7/034* (2013.01); *H03B 2200/0074* (2013.01); *H03B 2200/0082* (2013.01); *H03B 2200/0088* (2013.01)

(58) Field of Classification Search
CPC ....... H03L 7/099; H03L 7/0802; H03D 3/006; H03B 2200/0082; H03B 2200/0074; H03B 2200/0088

USPC .............................. 375/219, 220, 222; 331/2
See application file for complete search history.

(56) References Cited

U.S. PATENT DOCUMENTS

| | | |
|---|---|---|
| 2002/0039039 A1 | 4/2002 | Maligeorgos |
| 2006/0049977 A1 | 3/2006 | Vacanti |
| 2010/0214172 A1 | 8/2010 | Yeh |

FOREIGN PATENT DOCUMENTS

| | | |
|---|---|---|
| TW | 201126894 | 8/2011 |
| TW | 201312951 | 3/2013 |
| TW | 201428325 | 7/2014 |
| TW | 201448478 | 12/2014 |
| WO | 2015042814 A1 | 4/2015 |

* cited by examiner

DETECTOR GENERATING A DISPLACEMENT SIGNAL BY INJECTION LOCKING AND INJECTION PULLING

CROSS REFERENCE TO RELATED APPLICATION

This is a continuation-in-part application of U.S. application Ser. No. 15/076,685, filed on Mar. 22, 2016, which is included herein by reference.

TECHNICAL FIELD

The present invention relates to a detector, and more particularly, a detector including a frequency multiplier generating an output signal by injection pulling.

BACKGROUND

In general, a detector detecting the status of displacement of an object by the Doppler effect requires a high frequency input signal from an oscillation source operated at a high frequency to update the status of displacement of the object. Since it is difficult to process a high frequency signal with a digital process, an analog process is usually used to process the signal. Therefore, the signal is affected by flicker noise easily, the signal noise ratio (SNR) is reduced seriously, and the difficulty of subsequent digital signal processing (DSP) is increased. Furthermore, since the oscillation source is operated at a high frequency (e.g. around 10 GHz) which cannot be decreased, the power consumption of the oscillation source cannot be decreased easily. A solution with lower power consumption and smaller effect by flicker noise is required in this field.

SUMMARY

An embodiment of the present invention provides a detector for detecting a displacement of an object. The detector includes a frequency multiplier and a transceiving node. The frequency multiplier includes a first injection terminal, a second injection terminal and an output terminal. The first injection terminal is used to receive a first injection signal having a first frequency. The output terminal is used to output an output signal. The second injection terminal is used to receive a second injection signal having a second frequency. The frequency multiplier is used to output the output signal at a frequency substantially equal to a multiple of the first frequency by injection locking and pull the output signal to the second frequency by injection pulling. The transceiving node is coupled to the output terminal and the second injection terminal of the frequency multiplier. The transceiving node is used to transmit the output signal, and receive a received signal having a third frequency. The received signal is used to update the second injection signal, and the received signal or the output signal is related to the displacement of the object.

DETAILED DESCRIPTION

Figure 1:
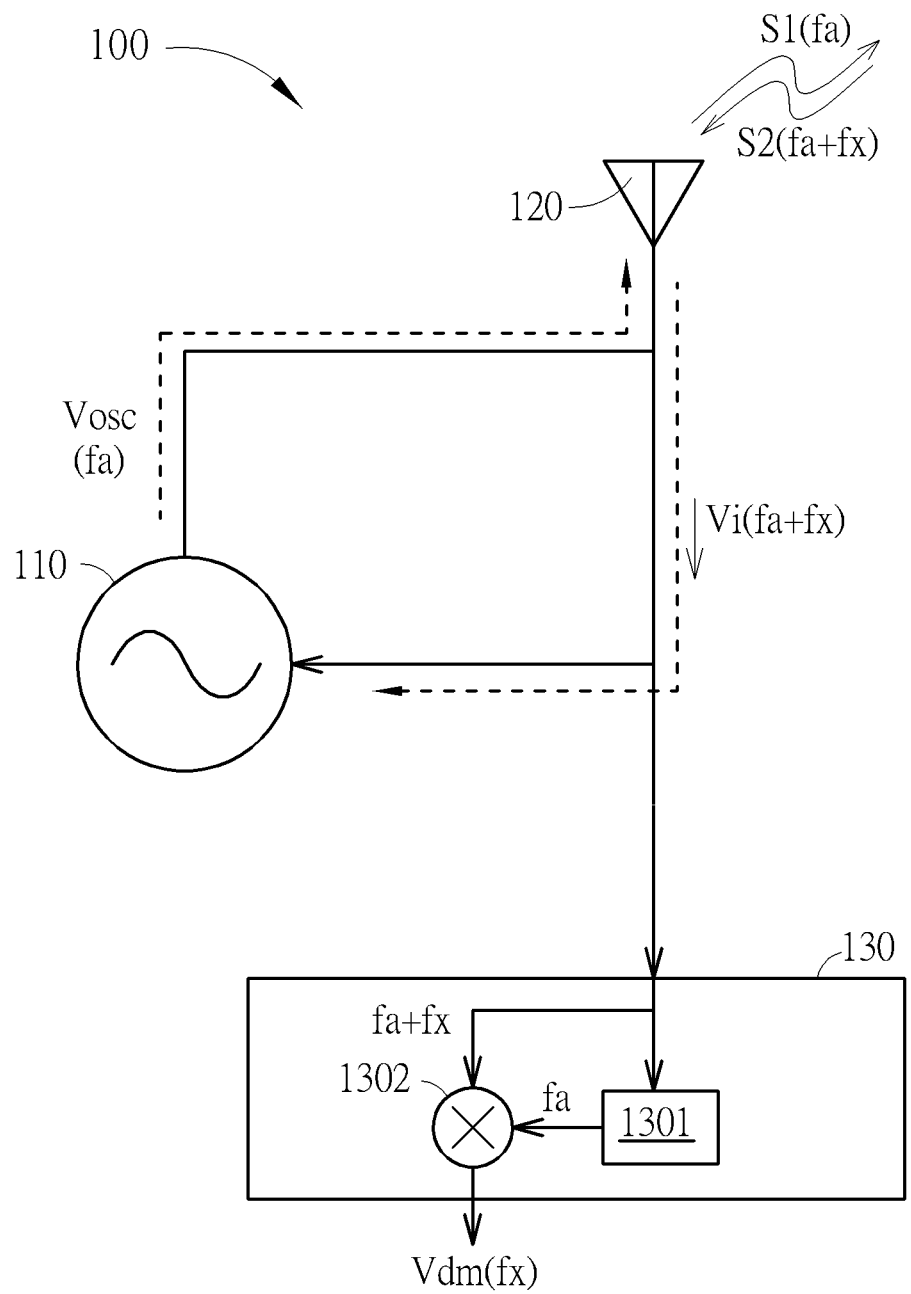
FIG. 1 illustrates a detector according to an embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 illustrates a detector 100 according to an embodiment of the present invention. The detector 100 includes an oscillation source 110, an antenna 120 and a demodulator 130. The demodulator 130 includes a delay 1301 and a frequency mixer 1302. The oscillation source 110 generates an output signal Vosc with a frequency fa at beginning so that the antenna 120 may transmit a detection signal S1 with the frequency fa outward. When the detection signal S1 detects a detected object, a reflection signal S2 is reflected back and received by the antenna 120, and an input signal Vi is generated accordingly and sent to the oscillation source 110 and the demodulator 130. The reflection signal S2 has a frequency (fa+fx), so the difference between the frequency (fa+fx) of the reflection signal S2 and the frequency fa of the detection signal S1 is a frequency fx. The input signal Vi has the frequency (fa+fx) according to the reflection signal S2. The frequency fx is determined by the Doppler effect. The frequency fx is a positive value when the detected object moves toward the detector 100, and the frequency fx is a negative value when the detected object moves away from the detector 100. The frequency fx may be updated according to the status of displacement of the detected object. When the input signal Vi is input into the demodulator 130, an analog process is used since the frequency (fa+fx) of the input signal Vi is high (e.g. 10 GHz±150 Hz). The demodulator 130 may perform FM demodulation so as to generate a demodulated signal Vdm, and then obtain information of the displacement of the detected object according to the demodulated signal Vdm. The delay 1301 and the frequency mixer 1302 are used to obtain the frequency fx bringing information of displacement of the detected object. The demodulated signal Vdm may be a voltage signal and processed in voltage domain. Since the demodulated signal Vdm is approximately a signal of with zero frequency, it is easily affected by flicker noise so as to decrease SNR and increase the difficulty of subsequent digital process.

Figure 2:
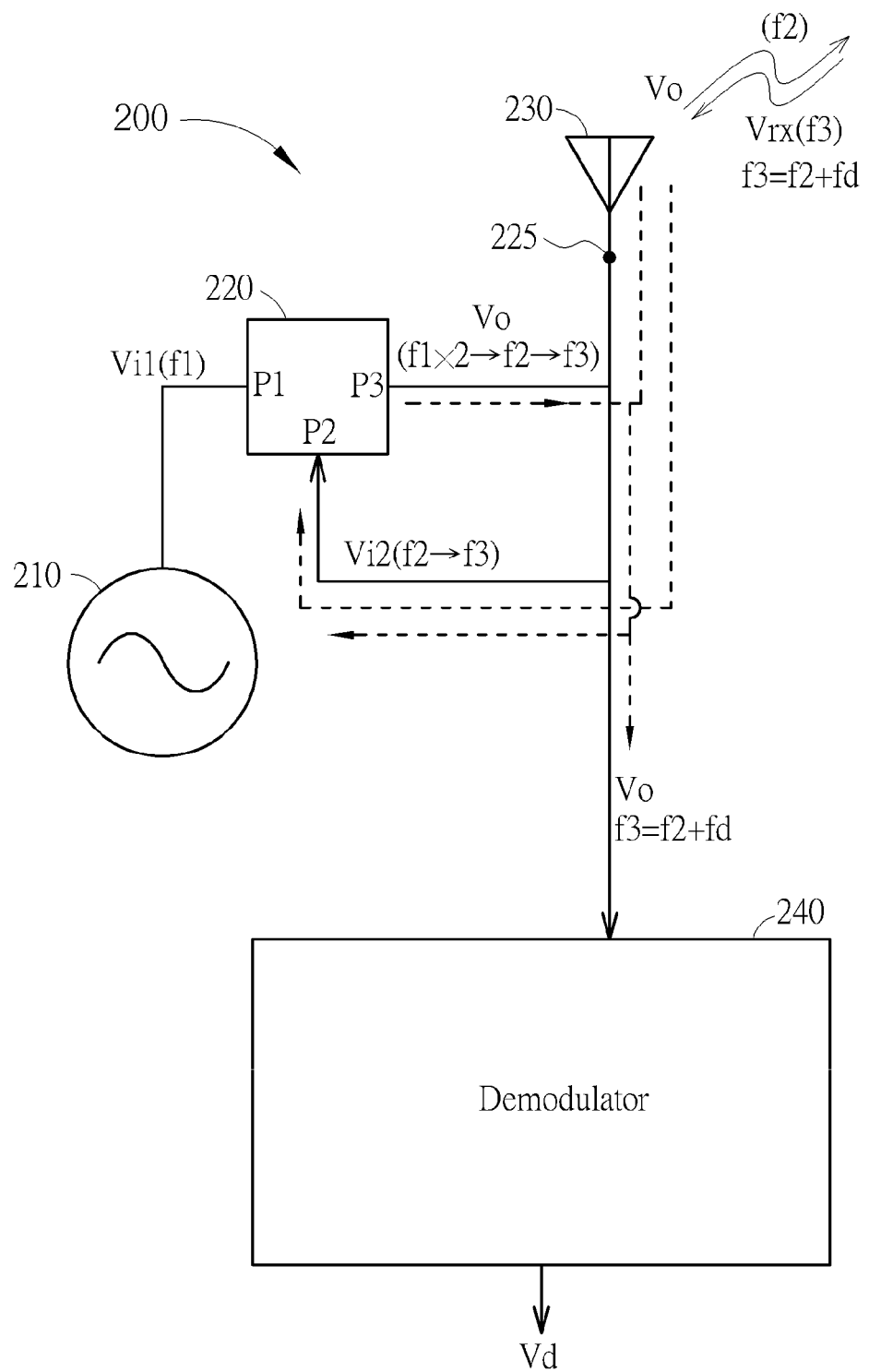
FIG. 2 illustrates a detector according to another embodiment of the present invention.

FIG. 2 illustrates a detector 200 according to another embodiment of the present invention. The detector 200 may include an oscillation source 210, a frequency multiplier 220, a transceiving node 225 and a demodulator 240. According to another embodiment, the detector 200 may further include a transceiver 230 coupled to the transceiving node 225. The transceiver 230 may be a device used to transmit and receive signals, for example, an antenna or a signal sensor. The oscillation source is used to generate an injection signal Vi1 having a frequency f1. The frequency multiplier 220 includes injection terminals P1 and P2, and an output terminal P3. The injection terminal P1 is coupled to the oscillation source 210, and used to receive the injection signal Vi1. The output terminal P3 is used to output an output signal Vo. The injection terminal P2 is used to receive an injection signal Vi2 having a frequency f2. The frequency multiplier 220 may output the output signal Vo at a frequency substantially equal to a multiple of the frequency f1 (e.g. 2f1, 3f1, etc.) by injection locking, and pulls the output signal Vo to the frequency f2 by injection pulling. The frequency multiplier 220 may be a double, triple or n-times frequency multiplier, where n is a positive integer. The transceiver 230 is coupled to the output terminal P3 and the injection terminal P2 of the frequency multiplier 220, and used to transmit the output signal Vo, and receive a received signal Vrx having a frequency f3. The received signal Vrx is used to update the injection signal Vi2. The demodulator 240 is coupled to the output terminal P3 of the frequency multiplier 220, and used to perform a demodulation operation so as to generate a displacement signal Vd according to the output signal Vo. The displacement signal Vd may be an analog signal or a digital signal. According to another embodiment of the present invention, the demodulator 240 is used to generate the displacement signal Vd according to the received signal Vrx.

For example, if the injection signal Vi2 has the frequency f2 (e.g. (10 G+300) Hz), the frequency of the output signal Vo may be pulled from the double of the frequency f1 (e.g. 5 G Hz), that is (f1×2) (e.g. 10 GHz), to the frequency f2 (e.g. to (10 G+300) Hz from 10 G Hz) by injection pulling. The transceiver 230 (e.g. an antenna) may transmit the output signal Vo having the frequency f2 (e.g. (10 G+300) Hz) outward. When detecting a detected object (e.g. a vehicle), the received signal Vrx may be reflected to the transceiver 230. The received signal Vrx may have the frequency f3. The relation of the frequency f3 of the received signal Vrx and the frequency f2 of the output signal Vo may be described by following equation α:

$$f3 = f2 + fd \quad (\alpha);$$

The frequency fd may be a difference frequency generated by the Doppler effect. The difference frequency fd may be positive if the detected object is moving forward the detector 200, and the difference frequency fd may be negative if the detected object is moving away from the detector 200. After the transceiver 230 receives the received signal Vrx having the frequency f3 (i.e. (f2+fd), for example, if fd is 100 Hz, and f2 is (10 G+300) Hz, f3 may be (10 G+300+100) Hz, that is (10 G+400) Hz), the received signal Vrx (e.g. with a frequency of (10 G+400) Hz) may be used to update the injection signal Vi2. Hence, the frequency of the injection signal Vi2 may be updated from the frequency f2 (e.g. (10 G+300) Hz) to the frequency f3 (e.g. (10 G+400) Hz). After the injection signal Vi2 is updated to the frequency f3 (e.g. (10 G+400) Hz), the output signal Vo may be pulled to the frequency f3 (e.g. (10 G+400) Hz) at the frequency multiplier 220 by injection pulling. The demodulator 240 may perform demodulation operation according to the frequency f3 (i.e. f2+fd) to generate the displacement signal Vd corresponding to the difference between the frequencies f2 and f3, that is the frequency fd. The status of the displacement of the detected object may be determined according to the displacement signal Vd. Comparing with the oscillation source 110 operated at a high frequency (e.g. 10 G Hz) in the previous embodiment, the operation frequency of the oscillation source 210 of the embodiment illustrated by FIG. 2 may be decreased to 50% or even lower according to the multiplier of the frequency multiplier 220, and power consumption may be effectively reduced. Furthermore, since the demodulation operation of the embodiment of the present invention is performed at an intermediate frequency instead of a zero frequency, the harmful effect of flicker noise can be better prevented as described below.

Figure 3:
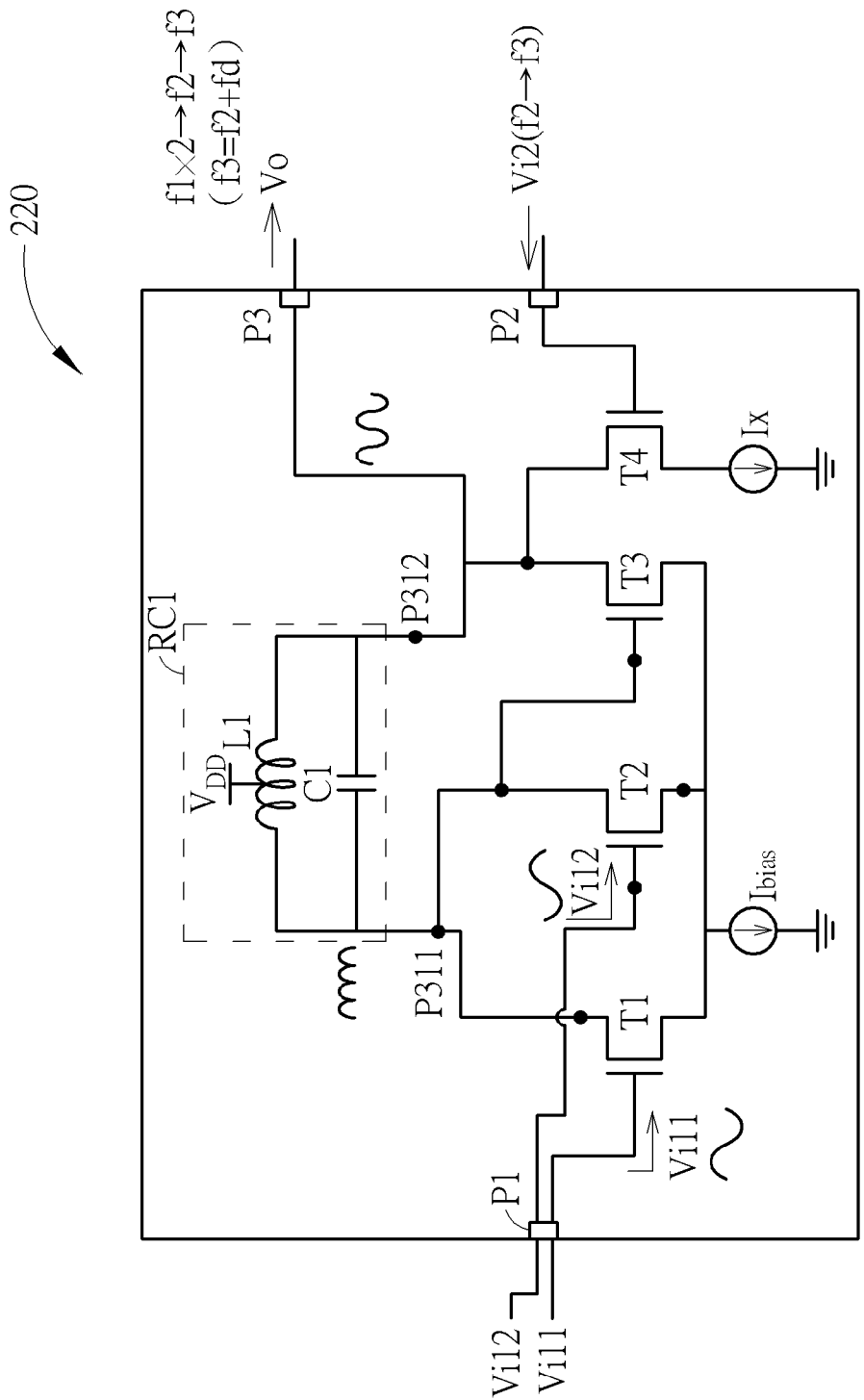
FIG. 3 illustrates the frequency multiplier in FIG. 2 according to an embodiment of the present invention.

FIG. 3 illustrates the frequency multiplier 220 according to an embodiment of the present invention. The frequency multiplier 220 includes a resonant circuit RC1 and transistors T1, T2, T3 and T4. The resonant circuit RC1 may be a tank circuit operated at a multiple (e.g. double) of the frequency f1, and includes at least a capacitor C1, at least an inductor L1, a first terminal P311, and a second terminal P312 coupled the output terminal P3 of the frequency multiplier 220. The inductor L1 may be coupled to a voltage source $V_{DD}$ according to an embodiment. The transistor T1 includes a gate terminal coupled to the injection terminal P1 and used to receive a first phase portion Vi11 of the injection signal Vi1, a first terminal coupled to the first terminal P311 of the resonant circuit RC1, and a second terminal coupled to a bias current source $I_{bias}$. The transistor T2 includes a gate terminal coupled to the injection terminal P1 and used to receive a second phase portion Vi12 of the injection signal Vi1, a first terminal coupled to the first terminal P311 of the resonant circuit RC1, and a second terminal coupled to the bias current source $I_{bias}$. The transistor T3 includes a gate terminal coupled to the first terminal P311 of the resonant circuit RC1, a first terminal coupled to the second terminal P312 of the resonant circuit RC1, and a second terminal coupled to the bias current source $I_{bias}$. The transistor T4 includes a gate terminal coupled to the injection terminal P2 and used to receive the injection signal Vi2, a first terminal coupled to the second terminal P312 of the resonant circuit RC1, and a second terminal coupled to a current source Ix. According to an embodiment of the present invention, the current source Ix and the bias current source $I_{bias}$ may be of an identical current source. FIG. 3 may be one of the designs of the frequency multiplier 220 rather than being used to limit the internal structure of the frequency multiplier 220, and a designer may adjust the internal circuit of the frequency multiplier 220 according to requirement of the product.

Figure 4:
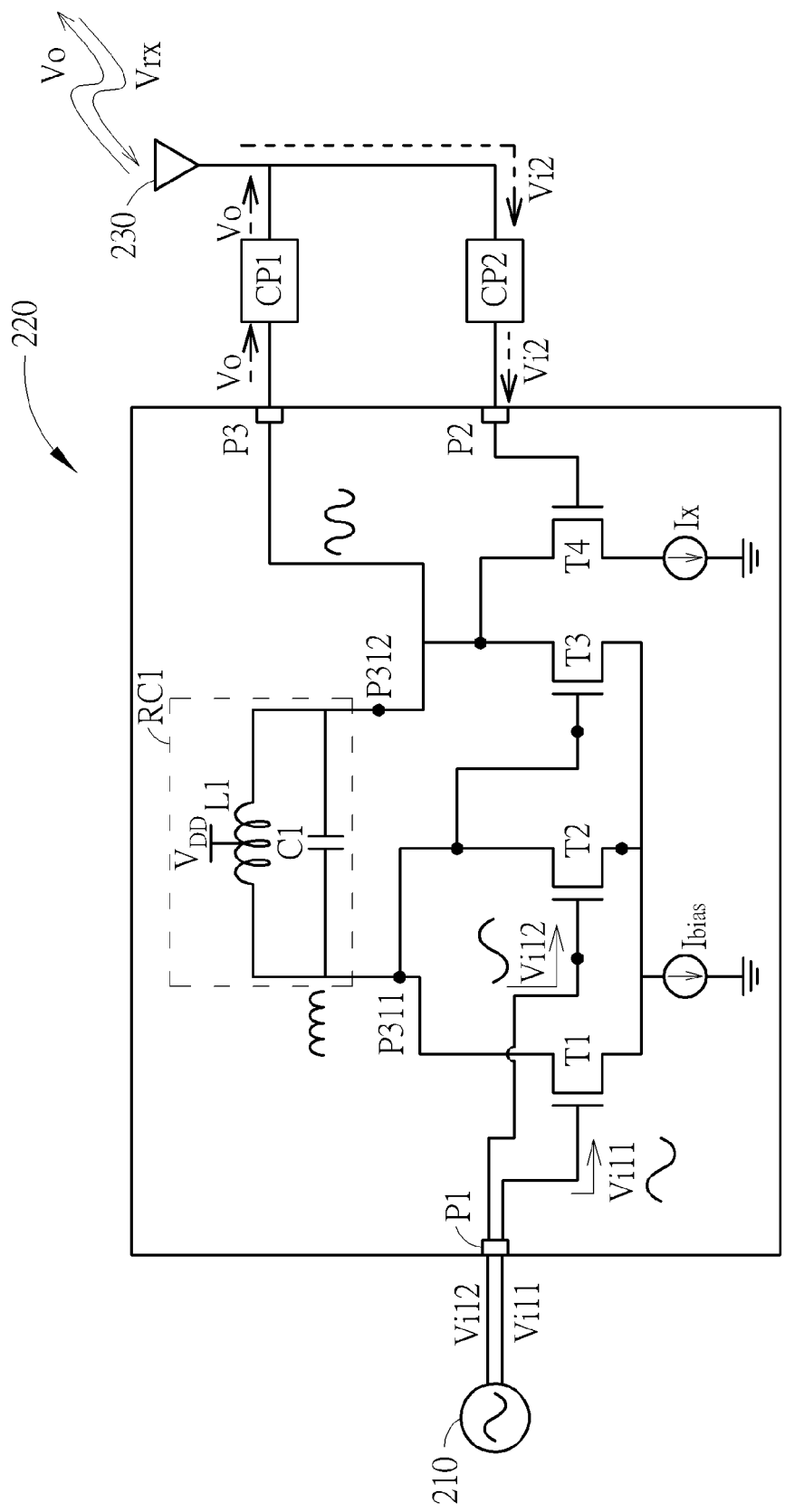
FIG. 4 illustrates that the frequency multiplier of FIG. 3 is coupled to the oscillation source and transceiver according to an embodiment of the present invention.

FIG. 4 illustrates that the frequency multiplier 220 of FIG. is coupled to the oscillation source 210 and transceiver 230 according to an embodiment of the present invention. According to FIG. 4, since the injection signal Vi1 is formed by the first phase portion Vi11 and second phase portion Vi12, the signals Vi11 and Vi12 may be input to the transistors T1 and T2 respectively. According to another embodiment, if the injection signal Vi1 is a single signal, an inverter may be coupled to the gate terminal of the transistor T2 so as to obtain a signal with a reversed phase of the injection signal Vi1. According to embodiment shown in FIG. 4, a coupling unit CP1 may be disposed between the transceiver 230 and the output terminal P3 of the frequency multiplier 220, and another coupling unit CP2 may be disposed between and the transceiver 230 and the injection terminal P2 of the frequency multiplier 220. The coupling unit CP1/CP2 may include a power amplifier, a low noise amplifier and/or a capacitor. A designer may determine whether to dispose the coupling unit CP1 and/or the coupling unit CP2, and determine the sort of the coupling unit CP1/CP2 according to design requirement or result of measurement so as to improve the effect of detection. For example, a smaller capacitor may be chosen for signals of higher frequency.

Figure 5:
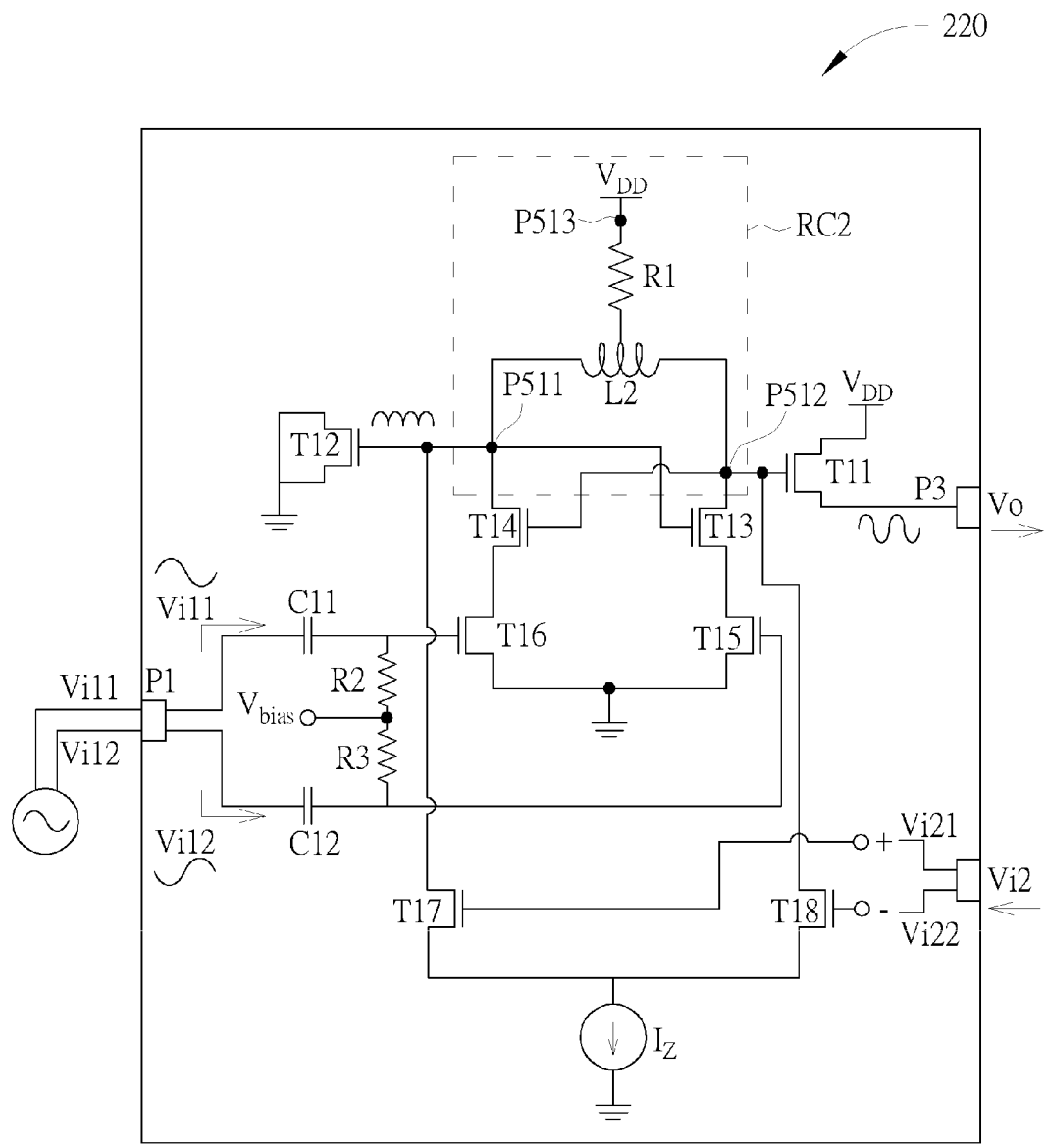
FIG. 5 illustrates the frequency multiplier in FIG. 2 according to another embodiment of the present invention.

FIG. 5 illustrates the frequency multiplier 220 according to another embodiment of the present invention. The frequency multiplier 220 may include a resonant circuit RC2, transistors T11-T18, resistors R2-R3 and capacitors C11-C12. The resonant circuit RC2 may be operated at a multiple of the frequency f1, and includes a resistor R1, an inductor L2, a voltage terminal P513 coupled to a voltage source $V_{DD}$, a first terminal P511 and a second terminal P512. The voltage terminal P513 may couple to the middle of the inductor L2 through the resistor R1. The transistor T11 may include a gate terminal coupled to the second terminal P512 of the resonant circuit RC2, a first terminal coupled to the voltage source $V_{DD}$, and a second terminal coupled to the output terminal P3 of the frequency multiplier 220. The transistor T12 may include a gate terminal coupled to the first terminal P511 of the resonant circuit RC2, a first terminal coupled to a ground terminal, and a second terminal coupled to the ground terminal. The transistor T13 may include a gate terminal coupled to the first terminal P511 of the resonant circuit RC2, a first terminal coupled to the second terminal P512 of the resonant circuit RC2, and a second terminal. The transistor T14 may include a gate terminal coupled to the second terminal P512 of the resonant circuit RC2, a first terminal coupled to the first terminal P511 of the resonant circuit RC2, and a second terminal. The transistor T15 may include a gate terminal, a first terminal coupled to the second terminal of the transistor T13, and a second terminal coupled to the ground terminal. The transistor T16 may include a gate terminal, a first terminal coupled to the second terminal of the transistor T14, and a second terminal coupled to the second terminal of the transistor T15 and the ground terminal. The resistor R2 may include a first terminal coupled to the gate terminal of the transistor T16, and a second terminal coupled to a bias voltage source $V_{bias}$. The resistor R3 may include a first terminal coupled to the bias voltage source $V_{bias}$, and a second terminal coupled to the gate terminal of the transistor T15. The capacitor C11 may include a first terminal coupled to the injection terminal P1 and used to receive the first phase portion Vi11 of the injection signal Vi1, and a second terminal coupled to the first terminal of the resistor R1. The capacitor C12 may include a first terminal coupled to the injection terminal P1 and used to receive the second phase portion Vi12 of the injection signal Vi1, and a second terminal coupled to the gate terminal of the transistor T15. The transistor T17 may include a first terminal coupled to the gate terminal of the transistor T12, a gate terminal coupled to the injection terminal P2 and used to receive the injection signal Vi2, and a second terminal coupled to a current source Iz. The transistor T18 includes a first terminal coupled to the gate terminal of the transistor T11, a gate terminal coupled to the second injection terminal P2 and configured to receive the second injection signal Vi2, and a second terminal coupled to the current source Iz. The current source Iz may be coupled to the ground terminal. According to an embodiment of the present invention, the gate terminal of the transistor T17 may be used to receive a first phase portion Vi21 of the injection signal Vi2, and the gate terminal of the transistor T18 may be used to receive a second phase portion Vi22 of the injection signal Vi2.

Figure 6:
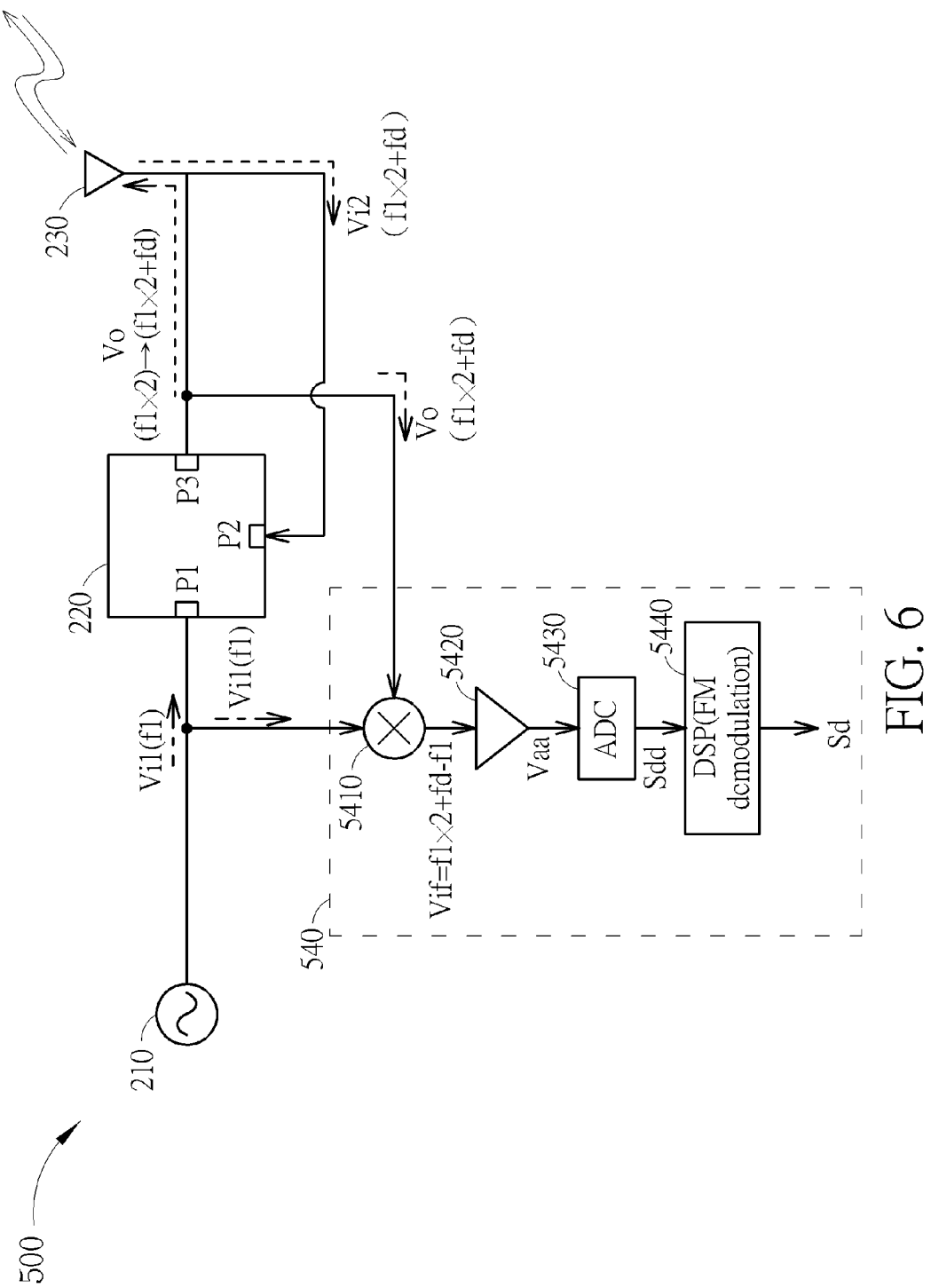
FIG. 6 illustrates a detector according to another embodiment of the present invention.

FIG. 6 illustrates a detector 500 according to another embodiment of the present invention. The detector 500 may include the oscillation source 210, the frequency multiplier 220, the transceiver 230 and a demodulator 540. The demodulator 540 may include a frequency mixer 5410, an amplifier 5420, an analog-to-digital converter (ADC) 5430 and a digital signal processor (DSP) 5440. The frequency mixer 5410 may include a mixer, be coupled to the injection terminal P1 and the output terminal P3 of the frequency multiplier 220, and be used to mix frequencies of the injection signal Vi1 and the output signal Vo to generate an intermediate frequency (IF) signal Vif. The amplifier 5420 may include a voltage amplifier and/or a current amplifier, be coupled to the frequency mixer 5410, and used to amplify the intermediate frequency signal Vif so as to generate an analog signal Vaa. The analog-to-digital converter 5430 may be coupled to the amplifier 5420 and used to convert the analog signal Vaa to a digital signal Sdd. The digital signal processor 5440 may be coupled to the analog-to-digital converter 5430 and used to demodulate the digital signal Sdd so as to generate the displacement signal Sd. The digital signal processor 5440 may perform FM (frequency modulation) demodulation. The displacement signal Sd may correspond to the status of displacement of the detected object, and the displacement signal Sd may be a digital signal.

For example, if the frequency multiplier 220 of FIG. 6 is a double multiplier, the injection signal Vi1 has the frequency f1 (e.g. 5 G Hz), and the output signal Vo is pulled by injection pulling so as to have a frequency as (f1×2+fd), that is twice the frequency f1 plus the difference frequency fd generated by the Doppler effect, the frequency of the intermediate frequency signal Vif outputted by the frequency mixer 5410 may be shown as the equation β:

The frequency of the intermediate frequency signal Vif $$\begin{aligned}&= \text{The frequency of the output signal } Vo - \text{The frequency of the} & (\beta)\\ &\quad \text{injection signal } Vi1\\ &= (f1 \times 2 + fd) - f1\\ &= f1 + fd.\end{aligned}$$

The frequency f1 as 5 G Hz, and the difference frequency fd generated by the Doppler effect triggered by the movement of the detected object as 150 Hz may be taken for example. Regarding the input signal Vi processed by the demodulator 130 in FIG. 1, the frequency of the input signal Vi may be (fa+fx), that is (10 G+150) Hz for example, hence it is known that the frequency of the intermediate frequency signal Vif (e.g. (5 G+150) Hz) may be of an intermediate frequency and with much lower frequency than the input signal Vi processed by the demodulator 130 shown in FIG. 1. Hence, in the embodiment of FIG. 6, the intermediate frequency signal Vif may be processed by using a digital process, and is allowed to be amplified, converted from analog to digital and processed with DSP without being FM demodulated first. Hence, the amplifier 5420 generating the analog signal Vaa, and the analog-to-digital converter 5430 generating the digital signal Sdd may be performed in frequency domain. Since none of the analog signal Vaa and the digital signal Sdd is an approximate zero frequency signal, the demodulator 540 is difficult to be affected by flicker noise. When the digital signal processor 5440 generates the displacement signal Sd, the FM demodulation is performed. Comparing FIG. 6 with FIG. 1, it is known that the frequency of the processed signal may be reduced at the front-end (e.g. the frequency mixer 5410) in the embodiment of FIG. 6 so that the intermediate frequency signal may be processed by a digital process, and the reduction of SNR caused by flicker noise may be prevented.

Figure 7:
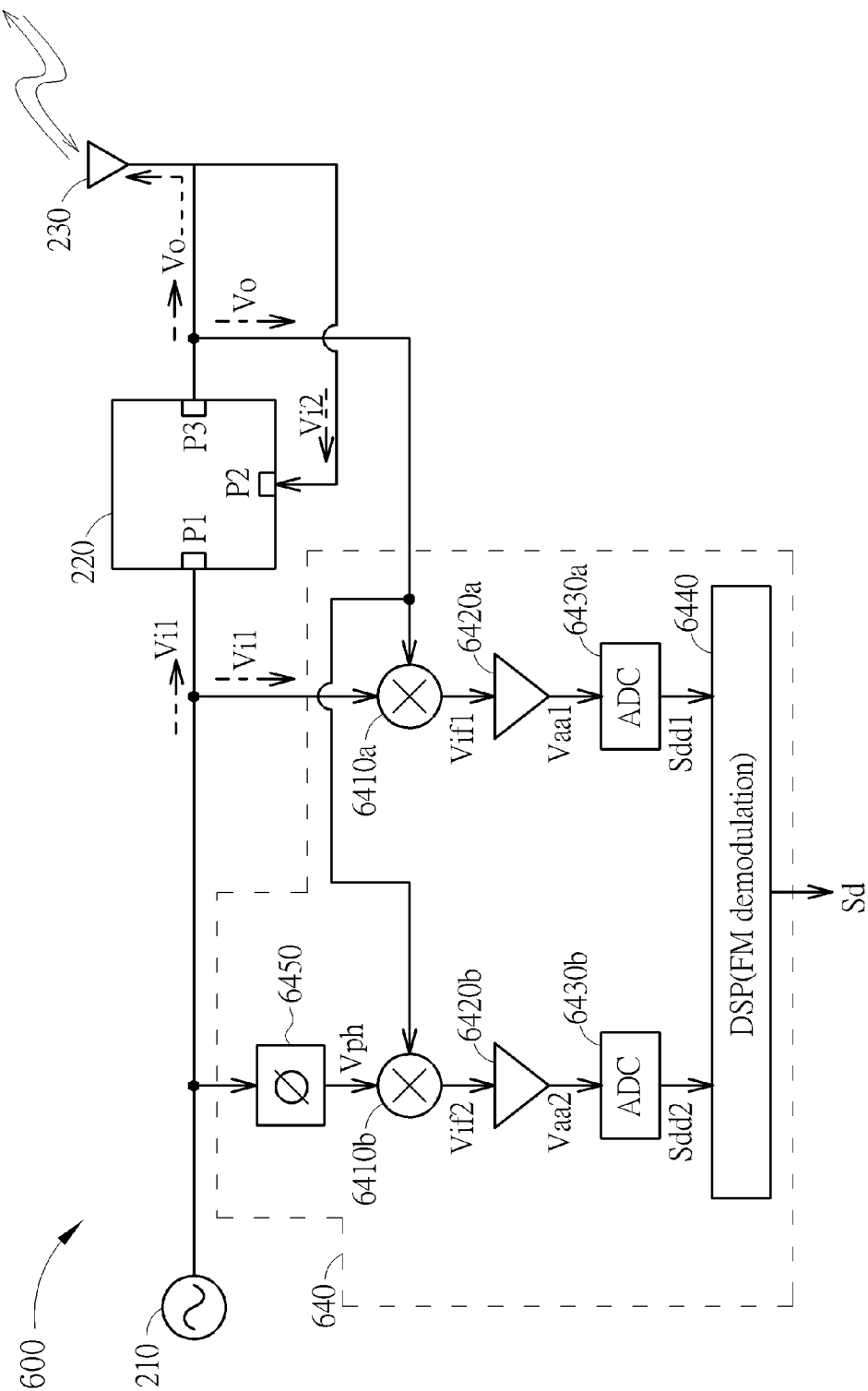
FIG. 7 illustrates a detector according to another embodiment of the present invention.

FIG. 7 illustrates a detector 600 according to another embodiment of the present invention. A demodulator 640 of the detector 600 may include frequency mixers 6410*a* and 6410*b*, amplifiers 6420*a* and 6420*b*, analog-to-digital converters 6430*a* and 6430*b*, a phase adjustment unit 6450 and a digital signal processor 6440. The frequency mixer 6410*a* may be coupled to the injection terminal P1 and the output terminal P3 of the frequency multiplier 220, and be used to mix frequencies of the injection signal Vi1 and the output signal Vo to generate an intermediate frequency signal Vif1. The amplifier 6420*a* may be coupled to the frequency mixer 6410*a* and be used to amplify the intermediate frequency signal Vif1 to generate an analog signal Vaa1. The analog-to-digital converter 6430*a* may be coupled to the amplifier 6420*a* and be used to convert the analog signal Vaa1 to a digital signal Sdd1. The phase adjustment unit 6450 may be coupled to the oscillation source 210 and be used to receive the injection signal Vi1 and adjust a phase of the injection signal Vi1 (e.g. by shifting 90 degrees) so as to generate a phase shift signal Vph. The frequency mixer 6410*b* may be coupled to the phase adjustment unit 6450 and the output terminal P3 of the frequency multiplier 220, and be used to mix frequencies of the phase shift signal Vph and the output signal Vo to generate an intermediate frequency signal Vif2. The amplifier 6420*b* may be coupled to the frequency mixer 6410*b* and be used to amplify the intermediate frequency signal Vif2 to generate an analog signal Vaa2. The analog-to-digital converter 6430*b* may be coupled to the amplifier 6420*b* and be used to convert the analog signal Vaa2 to a digital signal Sdd2. The digital signal processor 6440 may be coupled to the analog-to-digital converters 6430*a* and 6430*b*, and be used to demodulate the digital signals Sdd1 and Sdd2 so as to generate the displacement signal Sd. In FIG. 7, the demodulator 640 with a dual-path structure may support dual-path signals such as I-Q signals. For example, the frequency mixer 6410*a*, the amplifier 6420*a* and the analog-to-digital converter 6430*a* may be used to process the I-signal, and the frequency mixer 6410*b*, the amplifier 6420*b* and the analog-to-digital converter 6430*b* may be used to process the Q-signal. Since the I-signal is different from the Q-signal (e.g. the I-Q signals being of a sine waveform and a cosine waveform respectively), blind zones led by standing waves may be avoided. The structure shown in FIG. 7 with the dual-path structure may support I-Q signals to improve a demodulation performance.

Figure 8:
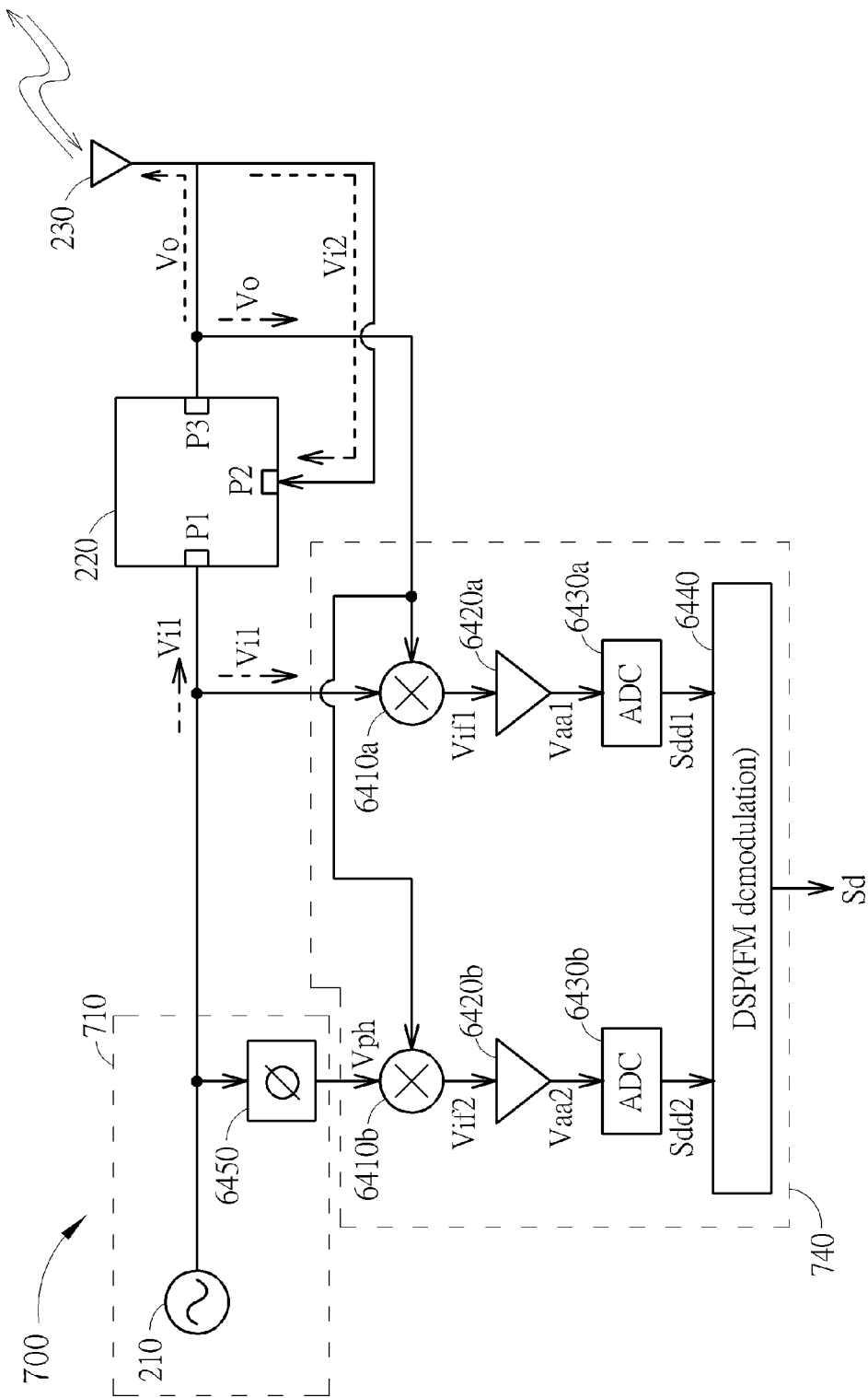
FIG. 8 illustrates a detector according to another embodiment of the present invention.

FIG. 8 illustrates a detector 700 according to another embodiment of the present invention. The detector 700 may include an oscillation source 710, a frequency multiplier 220, a transceiver 230 and a demodulator 740. The demodulator 740 may include the frequency mixers 6410*a* and 6410*b*, the amplifiers 6420*a* and 6420*b*, the analog-to-digital converters 6430*a* and 6430*b*, and the digital signal processor 6440. Different from the demodulator 640 of FIG. 7, the demodulator 740 may not include the phase adjustment unit 6450. The oscillation source 710 may output the injection signal Vi1 having the frequency f1 and the phase shift signal Vph generated by adjusting the phase of the injection signal Vi1 (e.g. shifting the phase of the injection signal Vi1 by 90 degrees). The operations of the frequency mixers 6410*a* and 6410*b*, the amplifiers 6420*a* and 6420*b*, the analog-to-digital converters 6430*a* and 6430*b*, and the digital signal processor 6440 may be as described in FIG. 7, and are not repeated herein. The oscillation source 710 providing two signals with different phases may be required in the detector 700, and dual-path signals such as I-Q signals may be supported to improve a demodulation performance.

Figure 9:
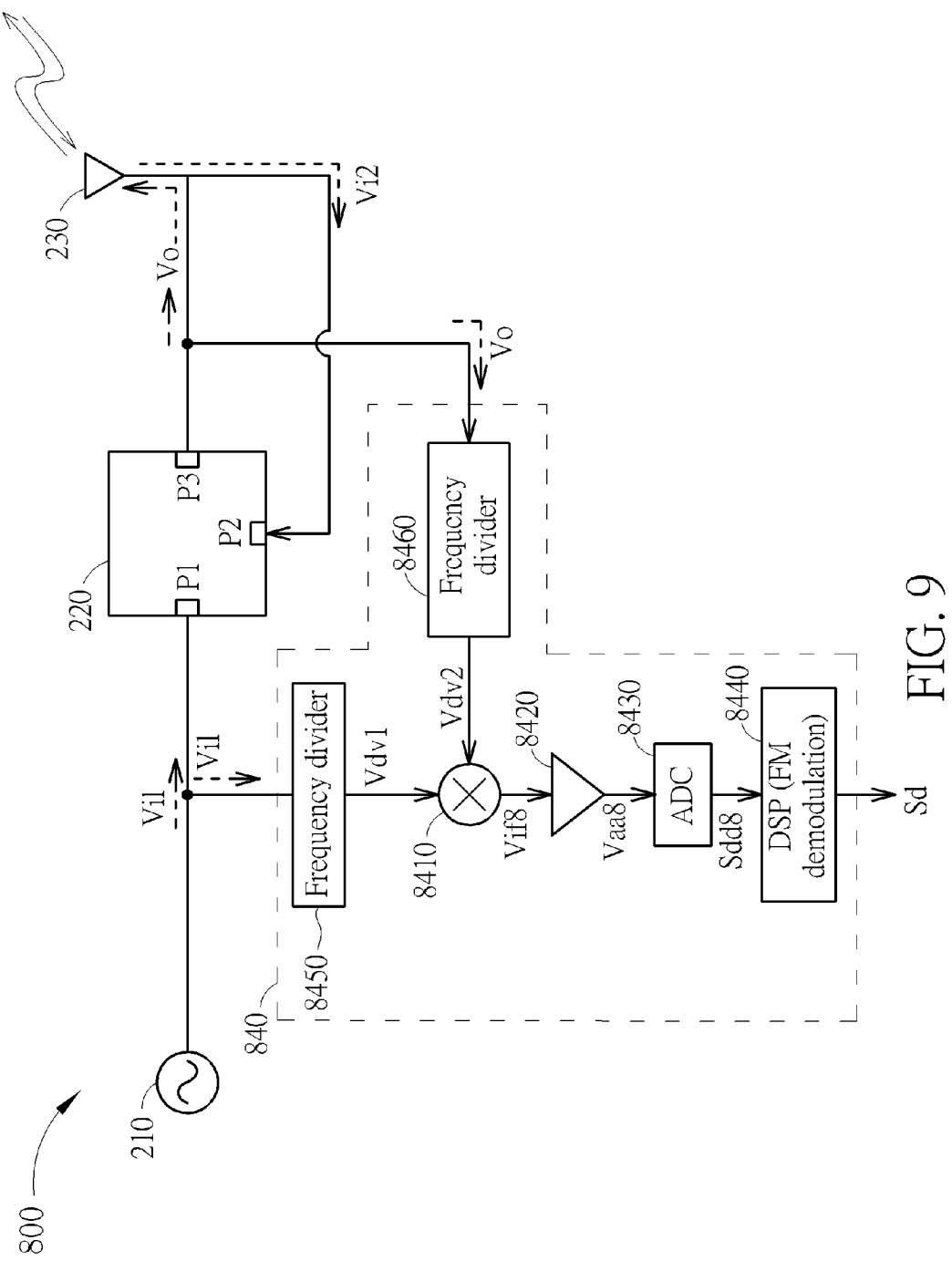
FIG. 9 illustrates a detector according to another embodiment of the present invention.

FIG. 9 illustrates a detector 800 according to an embodiment of the present invention. The detector 800 may include the oscillation source 210, the frequency multiplier 220, the transceiver 230 and a demodulator 840. The operations of the oscillation source 210, the frequency multiplier 220 and the transceiver 230 may be as described above, and are not repeated herein. The demodulator 840 includes frequency dividers 8450 and 8460, a frequency mixer 8410, an amplifier 8420, an analog-to-digital converter 8430 and a digital signal processor 8440. The frequency divider 8450 may be coupled to the oscillation source 210 and be used to divide frequency of the injection signal Vi1 so as to generate a frequency-divided signal Vdv1. The frequency divider 8460 may be coupled to the output terminal P3 of the frequency multiplier 220, and be used to divide frequency of the output signal Vo so as to generate a frequency-divided signal Vdv2. The frequency mixer 8410 may be coupled to the frequency dividers 8450 and 8460, and be used to mix frequencies of the frequency-divided signals Vdv1 and Vdv2 so as to generate an intermediate frequency signal Vif8. The amplifier 8420 may be coupled to the frequency mixer 8410 and be used to amplify the intermediate frequency signal Vif8 so as to generate an analog signal Vaa8. The analog-to-digital converter 8430 may be coupled to the amplifier 8420 and be used to convert the analog signal Vaa8 to a digital signal Sdd8. The digital signal processor 8440 may be coupled to the analog-to-digital converter 8430 and be used to demodulate the digital signal Sdd8 so as to generate the displacement signal Sd.

The frequency divider 8450 may perform frequency division with a divisor X, and the frequency divider 8460 may perform frequency division with a divisor Y. Suppose the frequency of the injection signal Vi1 is 5 G Hz, the frequency of the output signal Vo is 10 G Hz, the divisor X is 4 and the divisor Y is 9, the frequency of the intermediate frequency signal Vif8 may be described as the equation γ.

$$\begin{aligned}
\text{The frequency of the intermediate signal } Vif8 & \quad (\gamma) \\
= |(\text{frequency of the output signal } Vo) \div Y - (\text{frequency of the} & \\
\text{injection signal } Vi1) \div X| & \\
= |10 \text{ G Hz} \div 9 - 5 \text{ G Hz} \div 4| & \\
= 139 \text{ MHz}. &
\end{aligned}$$

Hence, the frequency of the intermediate frequency Vif8 may be reduced to be relatively low so as to be easily processed by a digital signal process. The intermediate frequency Vif8 may be processed by the amplifier 8420 and the analog-to-digital converter 8430, and then be FM demodulated when being processed by the digital signal processor 8440. Since the intermediate frequency Vif8 may not be processed approximately at a zero frequency, the detector 800 may not be affected by flicker noise easily.

Figure 10:
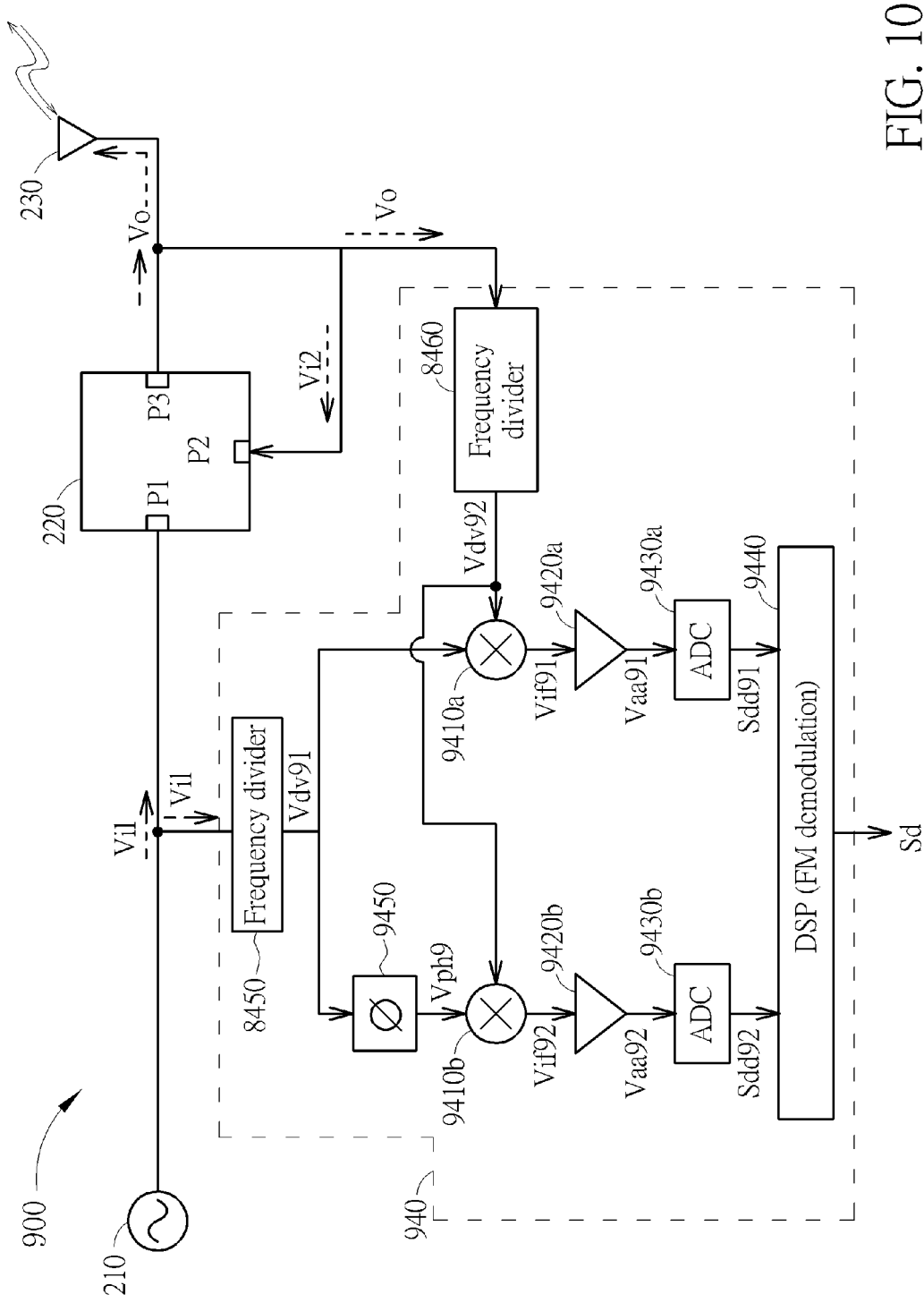
FIG. 10 illustrates a detector according to another embodiment of the present invention.

FIG. 10 illustrates a detector 900 according to another embodiment of the present invention. The detector 900 may include the oscillation source 210, the frequency multiplier 220, the transceiver 230 and a demodulator 940. The operations of the oscillation source 210, the frequency multiplier 220 and the transceiver 230 may be as described above, so are not repeated herein. The demodulator 940 may include the frequency dividers 8450 and 8460, frequency mixers 9410a and 9410b, amplifiers 9420a and 9420b, analog-to-digital converters 9430a and 9430b, a phase adjustment unit 9450, and a digital signal processor 9440. The frequency divider 8450 may be coupled to the oscillation source 210 and used to divide frequency of the injection signal Vi1 so as to generate a frequency-divided signal Vdv91. The frequency divider 8460 may be coupled to the output terminal P3 of the frequency multiplier 220 and used to divide frequency of the output signal Vo so as to generate a frequency-divided signal Vdv92. The frequency mixer 9410a may be coupled to the frequency dividers 8450 and 8460, and used to mix frequencies of the frequency-divided signals Vdv91 and Vdv92 so as to generate an intermediate frequency signal Vif91. The amplifier 9420a may be coupled to the frequency mixer 9410a and used to amplify the intermediate frequency signal Vif91 so as to generate an analog signal Vaa91. The analog-to-digital converter 9430a may be coupled to the amplifier 9420a and used to convert the analog signal Vaa91 to a digital signal Sdd91. The phase adjustment unit 9450 may be coupled to the frequency divider 8450 and used to receive the frequency-divided signal Vdv91 and adjust a phase of the frequency-divided signal Vdv91 so as to generate a phase shift signal Vph9. The frequency mixer 9410b may be coupled to the phase adjustment unit 9450 and the frequency divider 8460, and used to mix frequencies of the phase shift signal Vph9 and the frequency-divided signal Vdv92 so as to generate an intermediate frequency signal Vif92. The amplifier 9420b may be coupled to the frequency mixer 9410b and used to amplify the intermediate frequency signal Vif92 so as to generate an analog signal Vaa92. The analog-to-digital converter 9430b may be coupled to the amplifier 9420b and used to convert the analog signal Vaa92 to a digital signal Sdd92. The digital signal processor 9440 may be coupled to the analog-to-digital converters 9430a and 9430b, and used to demodulate the digital signals Sdd91 and Sdd92 so as to generate the displacement signal Sd. Similar to the detector 800, since the detector 900 includes the frequency dividers 8450 and 8460, the intermediate frequency signals processed by the detector 900 such as the intermediate frequency signals Vif91 and Vif92 may be of relatively low frequency (e.g. 130 MHz), it is easier to be processed by a digital signal process. FM demodulation may be not performed before the signals are sent to the amplifiers and analog-to-digital converters, so the effect of flicker noise may be avoided. Similar to the detector 500, since the detector 900 has a dual-path structure, it may support dual-path signals such as I-Q signals for a better effect of the demodulation.

Figure 11:
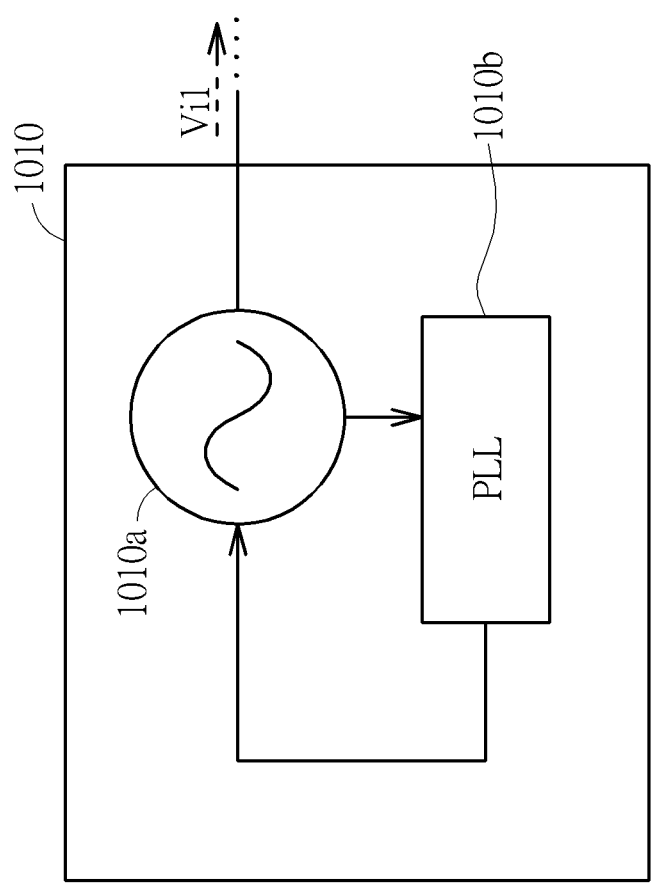
FIG. 11 illustrates an oscillation source in FIG. 2 according to an embodiment of the present invention.

FIG. 11 illustrates an oscillation source 1010 according to an embodiment of the present invention. The oscillation sources of the detectors mentioned above may be replaced by the oscillation source 1010. The oscillation source 1010 may include an oscillator 1010a and a phase-locked loop 1010b. If the oscillator 1010a is analog type, the phase-locked loop 1010b may be analog type. If the oscillator 1010a is digital type, the phase-locked loop 1010b may be digital type. The phase-locked loop 1010b may increase the stability of the frequency of the output signal from the oscillation source 1010 without being affected by temperature or supplied voltage. The detector may therefore be more suitable for accurate applications and communication regulations.

Figure 12:
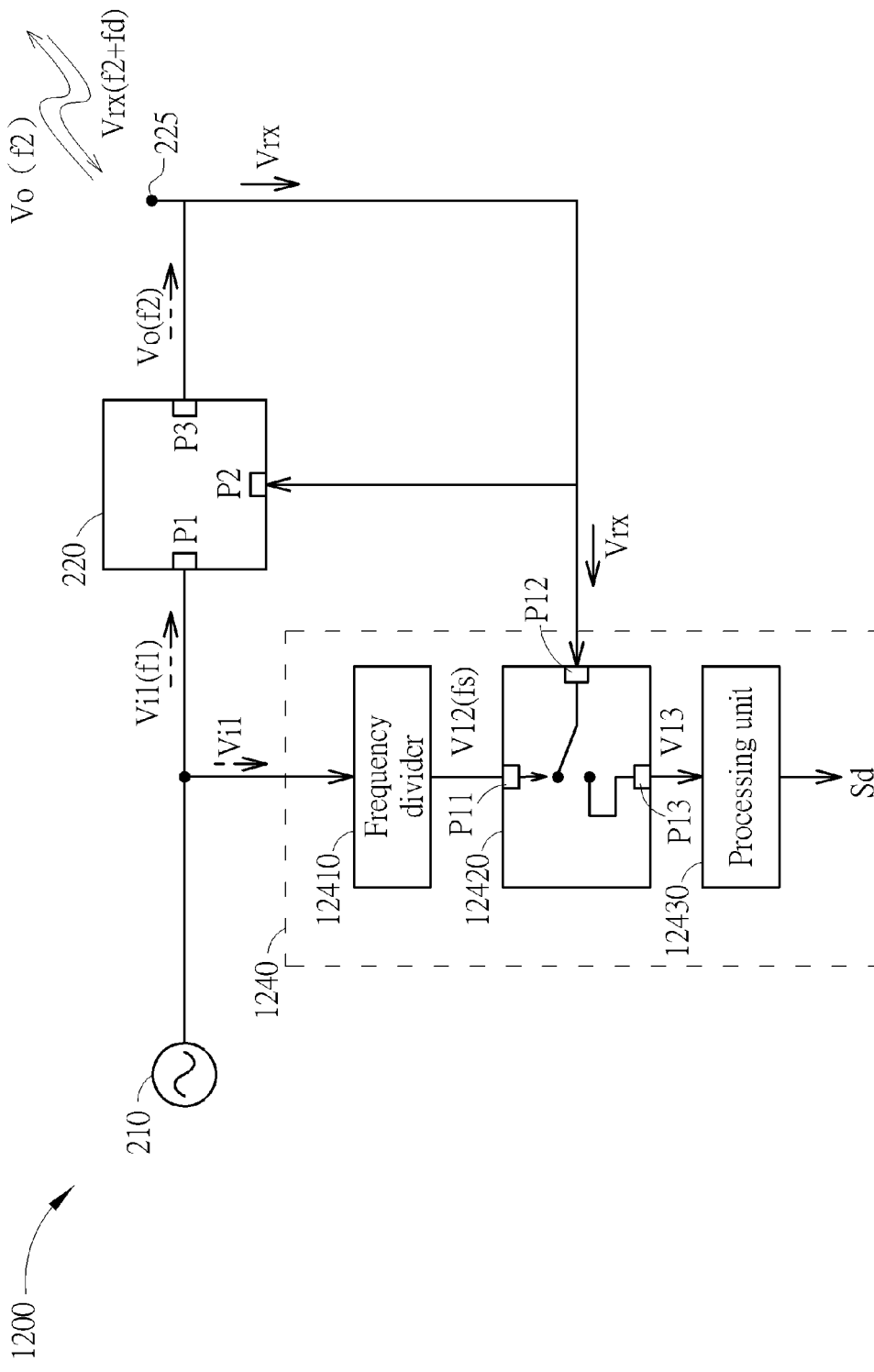
FIG. 12 illustrates a detector according to another embodiment of the present invention.

FIG. 12 illustrates a detector 1200 according to another embodiment of the present invention. The detector 1200 may include the frequency multiplier 220, the transceiving node 225 and a demodulator 1240. The demodulator 1240 may include a frequency divider 12410, a sampler 12420 and a processing unit 12430. The frequency divider 12410 may be coupled to the injection terminal P1 and used to divide frequency of the injection signal Vi1 so as to generate a signal V12 having a frequency fs. The sampler 12420 may use the signal V12 to sample the received signal Vrx for generating a sampled signal V13. The sampler 12420 may be a sub-sampler used to perform sub-sampling for using a relatively low-frequency signal to sample a high-frequency signal. The sampler 12420 may include input terminals P11-P12 and an output terminal P13. The input terminal P11 may be coupled to the frequency divider 12410 to receive the signal V12. The input terminal P12 may be coupled to the transceiving node 225 to receive the received signal Vrx. The output terminal P13 may be used to output the sampled signal V13. According to another embodiment of the present invention, the received signal or the output signal is related to the displacement of the object. For example, the received signal or the output signal could be used to generate a displacement signal corresponding to the displacement of the object. The processing unit 12430 may be coupled to the output terminal P13 of the sampler 12420 to receive the sampled signal V13 and be used to process the sampled signal V13 to generate the displacement signal Sd. According to another embodiment of the present invention, the sampler 12420 may use the signal V12 to sample the output signal Vo for generating a sampled signal V13, and the input terminal P12 may be coupled to the transceiving node 225 to receive the output signal Vo. The output signal Vo may be dynamically updated according to the received signal Vrx received by the multiplier 220.

Figure 13:
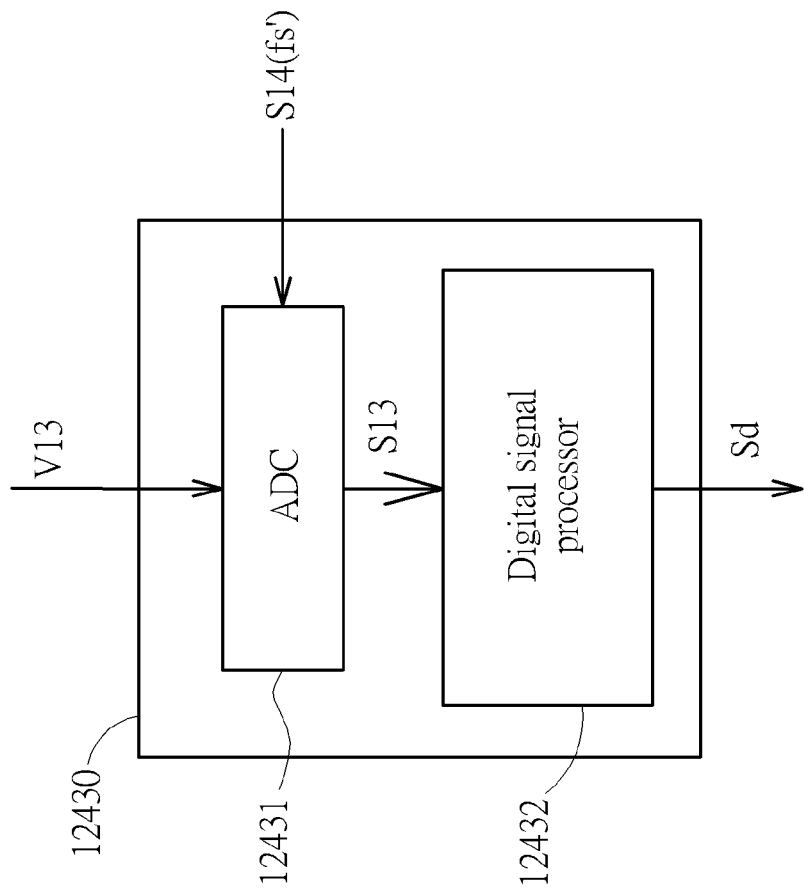
FIG. 13 illustrates a block diagram of the processing unit according to an embodiment of the present invention.

FIG. 13 illustrates a block diagram of the processing unit 12430 according to an embodiment of the present invention. The processing unit 12430 may include an analog-to-digital converter 12431 and a digital signal processor 12432. The analog-to-digital converter 12431 may be used to receive the sampled signal V13 and convert the sampled signal V13 to a digital signal S13 by using a sampling signal S14. The sampling signal S14 may have a frequency fs'. The digital signal processor 12432 may be coupled to the analog-to-digital converter 12431 and used to receive and process the digital signal S13 to generate the displacement signal Sd. According to embodiments of the present invention, the analog-to-digital converter 12431 may be a flash ADC, a sigma-delta modulation (SDM) ADC or a pipeline ADC. In a first example, when the analog-to-digital converter 12431 is a flash ADC, the bandwidth of the received signal Vrx is 3 MHz, and the frequency fs of the signal V12 is 10 MHz, the frequency fs' of the sampling signal S14 may be 10 MHz substantially. In a second example, when the analog-to-digital converter 12431 is an SDM ADC used under a similar condition of the first example, the frequency fs' may be 48 MHz substantially. In a third example, when the analog-to-digital converter 12431 is a pipeline ADC used under a similar condition of the first example, the frequency fs' may be 100 MHz substantially. Other appropriate sorts of ADC may be used according to embodiments of the present invention.

According to an embodiment of the present invention, the processing unit 12430 of FIG. 12 may include an analog signal processor used to process the sampled signal V13 to generate the displacement signal Sd. In FIG. 12, the frequency fs of the signal V12 may be greater than or substantially equal to twice the bandwidth of the received signal Vrx. For example, when the bandwidth of the received signal Vrx is 10 MHz, the frequency fs may be greater than or substantially equal to 20 MHz, that is to say, fs 20 MHz. Setting a lower limit of the frequency fs may avoid undesired aliasing when performing sub-sampling. Though the frequency fs may need to be larger than a lower limit, the frequency fs may be much less than the frequency of the output signal Vo from the multiplier 220. For example, referring to FIG. 12, when the frequency f2 of the output signal Vo is around 5.8 GHz, the frequency fs may be around 20 MHz. Hence, a signal with a much lower frequency may be used to sample a high frequency signal according to embodiments of the present invention. For example, in FIG. 12, the frequency fs may be much lower than the frequency of the output signal Vo or the frequency of the received signal Vrx. This may be beneficial for power consumption and hardware requirement.

Figure 14:
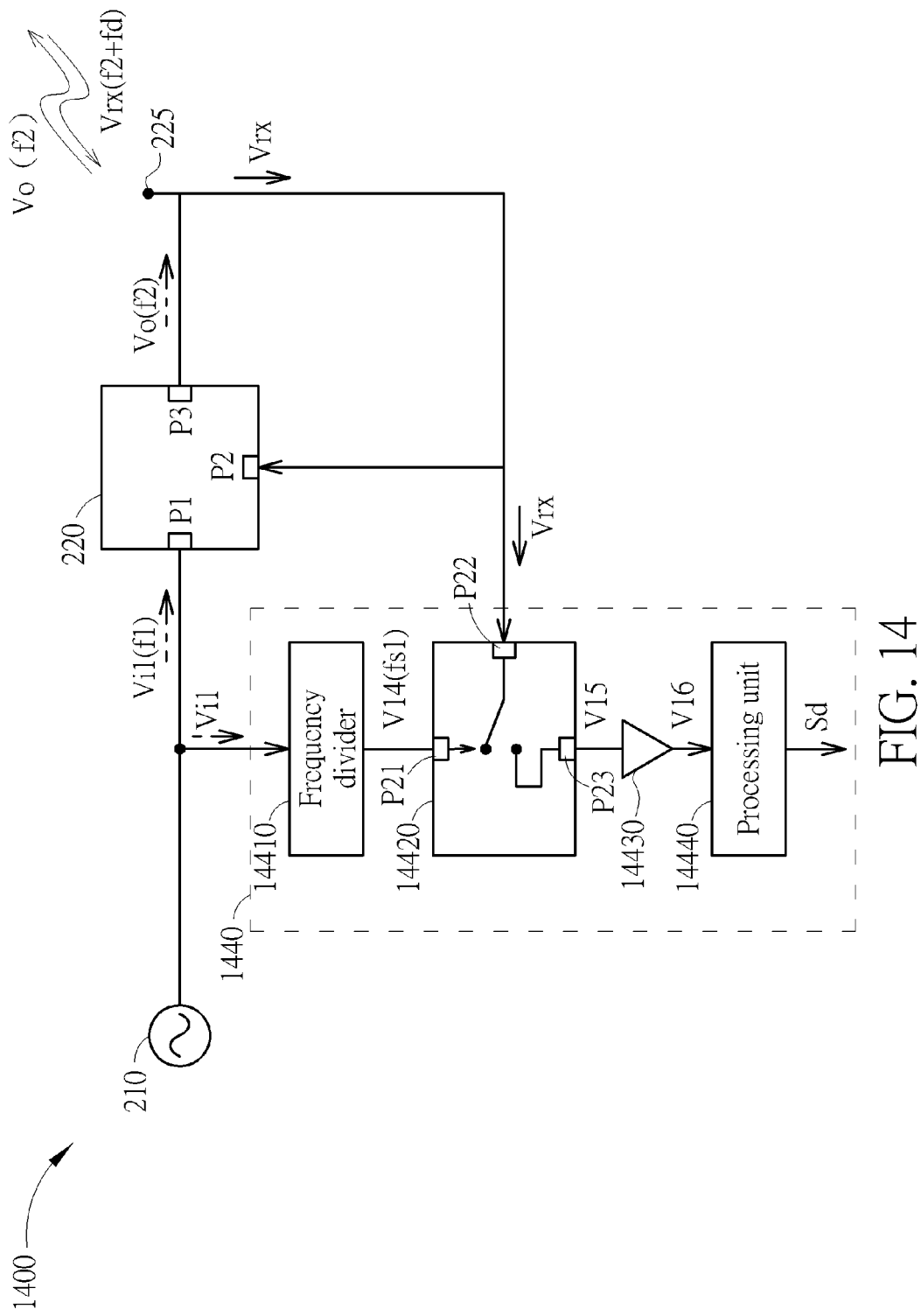
FIG. 14 illustrates a detector according an embodiment of the present invention.
Figure 15:
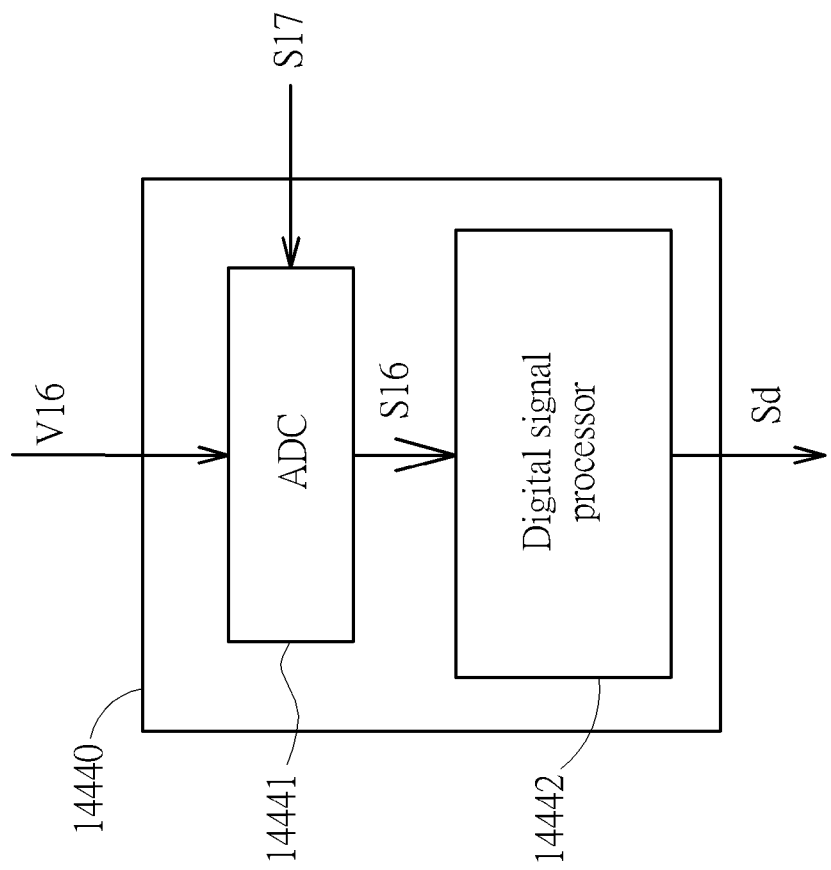
FIG. 15 illustrates a block diagram of the processing unit according to an embodiment of the resent invention.

FIG. 14 illustrates a detector 1400 according an embodiment of the present invention. The detector 1400 may include the frequency multiplier 220, the transceiving node 225 and a demodulator 1440. The demodulator 1440 may include a frequency divider 14410, a sampler 14420, a low pass filter 14430 and a processing unit 14440. The frequency divider 14410 may be coupled to the injection terminal P1 and used to divide frequency of the injection signal Vi1 so as to generate a signal V14 having a frequency fs1. The sampler 14420 may use the signal V14 to sample the received signal Vrx for generating a sampled signal V15. The sampler 14420 may include input terminals P21-P22 and an output terminal P23. The input terminal P21 may be coupled to the frequency divider 14410 to receive the signal V14. The input terminal P22 may be coupled to the transceiving node 225 to receive the received signal Vrx. The output terminal P23 may be used to output the sampled signal V15. The low pass filter 14430 may be coupled to the output terminal P23, and used to obtain a low frequency portion of the sampled signal V15 so as to generate a filtered signal V16. The processing unit 14440 may be coupled to the low pass filter 14430 to receive the filtered signal V16 and used to process the filtered signal V16 to generate the displacement signal Sd. According to an embodiment of the present invention, the frequency fs1 of the signal V14 may be greater than or substantially equal to twice the bandwidth of the received signal Vrx so as to avoid undesired aliasing. FIG. 15 illustrates a block diagram of the processing unit 14440 according to an embodiment of the present invention. The processing unit 14440 may include an analog-to-digital converter 14441 and a digital signal processor 14442. The analog-to-digital converter 14441 may be used to receive the filtered signal V16 and convert the filtered signal V16 to a digital signal S16 by using a sampling signal S17. The digital signal processor 14442 may be coupled to the analog-to-digital converter 14441 and used to receive and process the digital signal S16 to generate the displacement signal Sd. According to embodiments of the present invention, the analog-to-signal convertor 14441 may be a flash ADC, an SDM ADC or a pipeline ADC. According to another embodiment, the processing unit 14440 may include an analog signal processor used to process the filtered signal V16 to generate the displacement signal Sd. According to another embodiment of the present invention, the sampler 14420 may use the signal V14 to sample the output signal Vo for generating a sampled signal V15, and the input terminal P22 may be coupled to the transceiving node 225 to receive the output signal Vo.

Figure 16:
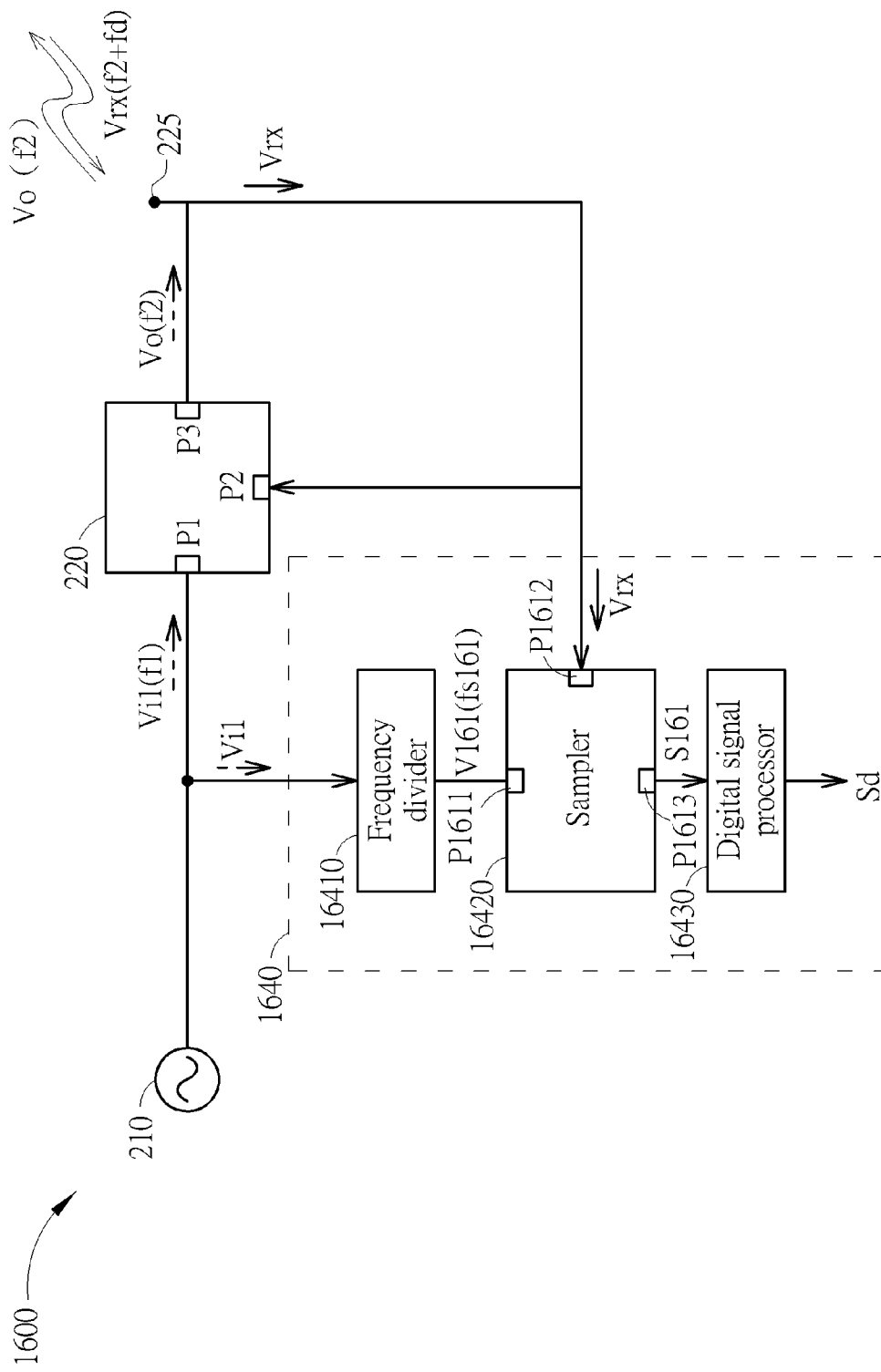
FIG. 16 illustrates a detector according to an embodiment of the present invention.

FIG. 16 illustrates a detector 1600 according to an embodiment of the present invention. The detector 1600 may include the frequency multiplier 220, the transceiving node 225 and a demodulator 1640. The demodulator 1640 may include a frequency divider 16410, a sampler 16420 and a digital signal processor 16430. The frequency divider 16410 may be coupled to the injection terminal P1 of the frequency multiplier 220 and used to divide frequency of the injection signal Vi1 to generate a signal V161 having a frequency fs161. The sampler 16420 may use the signal V161 to sample the received signal Vrx to generate a digital sampled signal S161 by analog-to-digital converting. The sampler 16420 may include input terminals 1611-1612 and an output terminal 1613. The input terminal 1611 may be coupled to the frequency divider 16410 to receive the signal V161. The input terminal 1612 may be coupled to the transceiving node 225 to receive the received signal Vrx. The output terminal P1613 may be used to output the digital sampled signal S161. The digital signal processor 16430 may be used to receive and process the digital sampled signal S161 to generate the displacement signal Sd. Comparing with the foresaid sampler 12420 (of FIG. 12) and the sampler 14420 (of FIG. 14), the sampler 16420 of FIG. 16 may have functions of analog-to-digital converting and sub-sampling. In other words, the sampler 14420 may be a sub-sampling ADC. Since analog-to-digital converting may be a sort of sampling, the signal V161 in FIG. 16 may be used to sample the received signal Vrx and perform analog-to-digital converting. Hence, the sampling signal S14 (of FIG. 13) or S17 (of FIG. 15) may be omitted according to the embodiment of FIG. 16. According to an embodiment of the present invention, the frequency fs161 of the signal V161 may be greater than twice the bandwidth of the received signal Vrx to avoid undesired signal aliasing when performing sub-sampling. According to another embodiment of the present invention, the sampler 16420 may use the signal V161 to sample the output signal Vo for generating a digital sampled signal S161 by analog-to-digital converting, and the input terminal 1612 may be coupled to the transceiving node 225 to receive the output signal Vo.

Using a sub-sampling ADC such as the sampler 16420 may be beneficial for reducing power consumption. For example, regarding FIG. 9, when the frequency of the injection signal Vi1 is 5 GHz, the frequency of the output signal Vo is 10 GHz, the divisor used by the frequency divider 8450 is 21 and the divisor used by the frequency divider 8460 is 40, the frequency of the intermediate signal Vif8 may be calculated as (10 GHz÷ 40−5 GHz÷21), that may be around 11.9 MHz. As shown in FIG. 9, two frequency dividers 8450-8460, the mixer 8410 and the ADC 8430 may be used, so the power consumption may be higher. In the above example, a sub-sampling ADC (SS-ADC) may be used to replace the frequency divider 8460, the mixer 8410 and the ADC 8430 shown in FIG. 9, and the divisor used by the frequency divider 8450 may be adjusted to be 841. Hence, an output signal outputted from the sub-sampler ADC may also have a frequency being about 11.9 MHz. The result may be similar to the frequency of the intermediate signal Vif8. Hence, the effect may be substantially equivalent. Increasing the divisor of the sub-sampling ADC may merely increase the operation current slightly. However, replacing the frequency divider 8460, the mixer 8410 and the ADC 8430 with a sub-sampling ADC may reduce the power consumed by the frequency divider 8460, the mixer 8410 and the ADC 8430. The power consumption may therefore be reduced.

Figure 17:
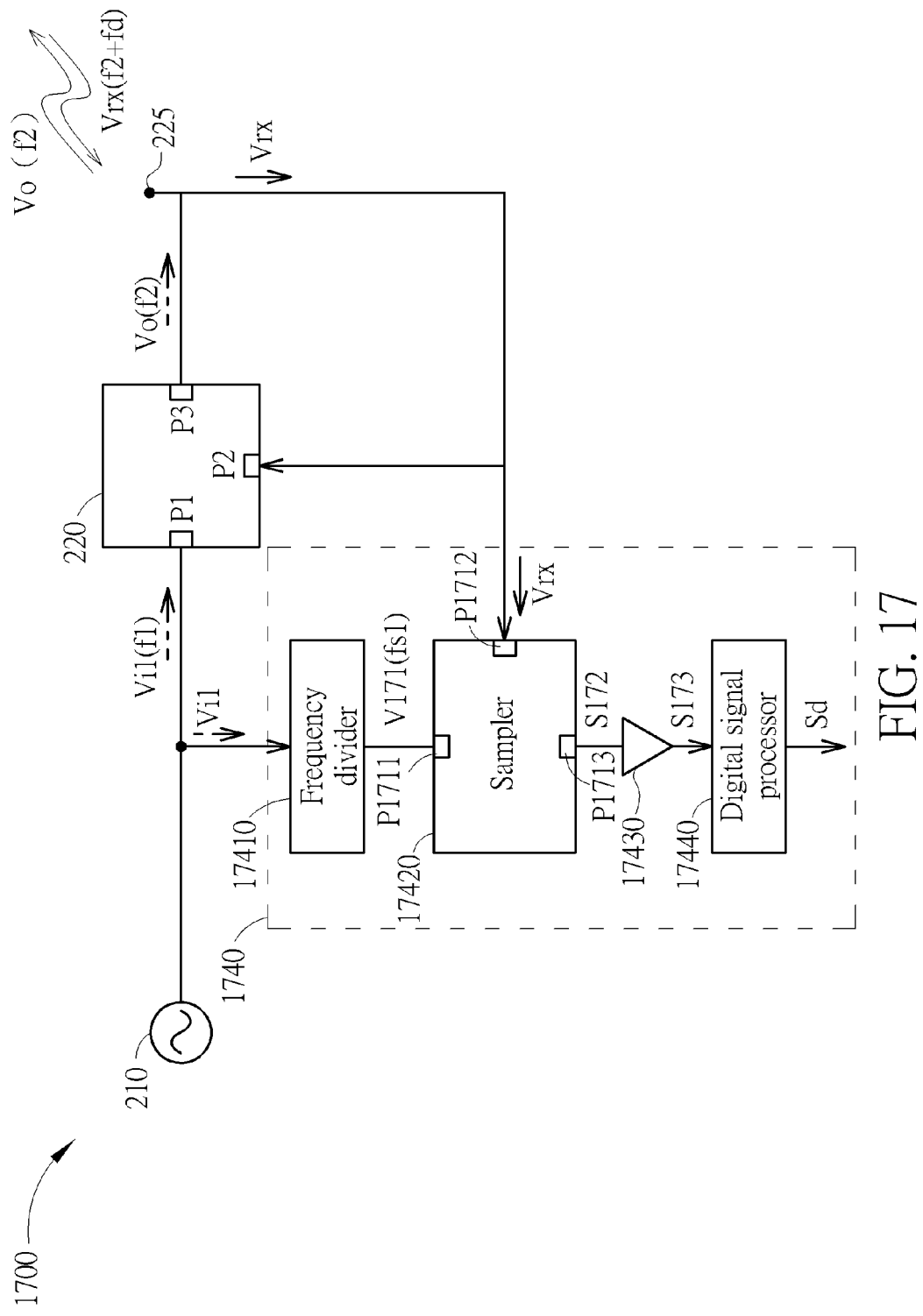
FIG. 17 illustrates a detector according to an embodiment of the present invention.

FIG. 17 illustrates a detector 1700 according to an embodiment of the present invention. The detector 1700 may include the frequency multiplier 220, the transceiving node 225 and a demodulator 1740. The demodulator 1740 may include a frequency divider 17410, a sampler 17420, a digital low pass filter 17430 and a digital signal processor 17440. The frequency divider 17410 may be coupled to the injection terminal P1 and used to divide frequency of the injection signal Vi1 to generate a signal V171 having a frequency fs171. The sampler 17420 may have an analog-to-digital conversion function. The sampler 17420 may use the signal V171 to sample the received signal Vrx to generate a digital sampled signal 5172 by analog-to-digital converting. The sampler 17420 may include input terminals P1711-P1712 and an output terminal 1713. The input terminal P1711 may be coupled to the frequency divider 17410 to receive the signal V171. The input terminal P1712 may be coupled to the transceiving node 225 to receive the received signal Vrx. The output terminal P1713 may be used to output the digital sampled signal 5172. The digital low pass filter 17430 may be coupled to the output terminal P1713 of the sampler 17420, and used to obtain a low frequency portion of the digital sampled signal 5172 so as to generate a filtered signal 5173. The digital signal processor 17440 may be coupled to the digital low pass filter 17430 to receive the filtered signal 5173 and used to process the filtered signal 5173 to generate the displacement signal Sd. The digital low pass filter 17430 may be a baseband filter. By using the digital low pass filter 17430, a medium frequency portion and a high frequency portion of the sampled signal 5172 may be removed for the digital signal processor to process the filtered signal 5173 easier. According to an embodiment of the present invention, the frequency fs171 of the signal V171 may be greater than twice the bandwidth of the received signal Vrx to avoid undesired signal aliasing when performing sub-sampling. According to another embodiment of the present invention, the sampler 17420 may use the signal V171 to sample the output signal Vo to generate a digital sampled signal 5172 by analog-to-digital converting, and the input terminal P1712 may be coupled to the transceiving node 225 to receive the output signal Vo.

In summary, the detectors disclosed by embodiments of the present invention may avoid the interference made by flicker noise so that the signal-to-noise ratio may not be reduced. Furthermore, the operation frequency of the oscillation sources used in the detectors disclosed by embodiments of the present invention may be decreased greatly, so the power consumption may be decreased. According to embodiments of the present invention, samplers performing sub-sampling may be used to further decrease an operating frequency so that the power consumption may be decreased. The shortcomings of low signal-to-noise ratio and high power consumption of the detectors of prior art may be effectively improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A detector for detecting a displacement of an object, the detector comprising:
   a frequency multiplier comprising:
      a first injection terminal configured to receive a first injection signal having a first frequency;
      an output terminal configured to output an output signal; and
      a second injection terminal configured to receive a second injection signal having a second frequency;
      wherein the frequency multiplier is configured to output the output signal at a frequency substantially equal to a multiple of the first frequency by injection locking and pull the output signal to the second frequency by injection pulling; and
   a transceiving node coupled to the output terminal and the second injection terminal of the frequency multiplier, and configured to transmit the output signal, and receive a received signal having a third frequency, wherein the received signal is used to update the second injection signal, and the received signal or the output signal is related to the displacement of the object.

2. The detector of claim 1, wherein the transceiving node is used to be coupled to an antenna, and the antenna is used for transmitting the output signal and receiving the received signal.

3. The detector of claim 1, further comprising:
   a frequency divider coupled to the first injection terminal and configured to divide frequency of the first injection signal so as to generate a fourth signal having a fourth frequency;
   a sampler configured to use the fourth signal to sample the received signal or the output signal for generating a sampled signal, the sampler comprising:
      a first terminal coupled to the frequency divider to receive the fourth signal;
      a second terminal coupled to the transceiving node to receive the received signal or the output signal respectively; and
      an output terminal configured to output the sampled signal; and
   a processing unit coupled to the output terminal of the sampler to receive the sampled signal and configured to process the sampled signal to generate the displacement signal.

4. The detector of claim 3, wherein the processing unit comprises:
   an analog-to-digital converter configured to receive the sampled signal and convert the sampled signal to a digital signal by using a sampling signal; and
   a digital signal processor coupled to the analog-to-digital converter and configured to receive and process the digital signal to generate the displacement signal.

5. The detector of claim 3, wherein the processing unit comprises an analog signal processor configured to process the sampled signal to generate the displacement signal.

6. The detector of claim 3, wherein the fourth frequency is greater than or substantially equal to twice a bandwidth of the received signal.

7. The detector of claim 3, wherein the fourth frequency is lower than the third frequency or the second frequency.

8. The detector of claim 1, further comprising:
   a frequency divider coupled to the first injection terminal and configured to divide frequency of the first injection signal so as to generate a fourth signal having a fourth frequency;

a sampler configured to use the fourth signal to sample the received signal or the output signal for generating a sampled signal, the sampler comprising:
- a first terminal coupled to the frequency divider to receive the fourth signal;
- a second terminal coupled to the transceiving node to receive the received signal or the output signal respectively; and
- an output terminal configured to output the sampled signal;

a low pass filter coupled to the output terminal of the sampler, and configured to obtain a low frequency portion of the sampled signal so as to generate a filtered signal; and a processing unit coupled to the low pass filter to receive the filtered signal and configured to process the filtered signal to generate the displacement signal.

9. The detector of claim 8, wherein the fourth frequency is greater than or substantially equal to twice a bandwidth of the received signal.

10. The detector of claim 8, wherein the fourth frequency is lower than the third frequency or the second frequency.

11. The detector of claim 8, wherein the processing unit comprises:
- an analog-to-digital converter configured to receive the filtered signal and convert the filtered signal to a digital signal by using a sampling signal; and
- a digital signal processor coupled to the analog-to-digital converter and configured to receive and process the digital signal to generate the displacement signal.

12. The detector of claim 8, wherein the processing unit comprises an analog signal processor configured to process the filtered signal to generate the displacement signal.

13. The detector of claim 1, further comprising:
- a frequency divider coupled to the first injection terminal and configured to divide frequency of the first injection signal to generate a fourth signal having a fourth frequency;
- a sampler configured to use the fourth signal to sample the received signal or the output signal to generate a digital sampled signal by analog-to-digital converting, and comprising:
  - a first terminal coupled to the frequency divider to receive the fourth signal;
  - a second terminal coupled to the transceiving node to receive the received signal or the output signal respectively; and
  - an output terminal configured to output the digital sampled signal; and
- a digital signal processor configured to receive and process the digital sampled signal to generate the displacement signal.

14. The detector of claim 13, wherein the fourth frequency is greater than twice a bandwidth of the received signal.

15. The detector of claim 13, wherein the fourth frequency is lower than the third frequency or the second frequency.

16. The detector of claim 1, further comprising:
- a frequency divider coupled to the first injection terminal and configured to divide frequency of the first injection signal to generate a fourth signal having a fourth frequency;
- a sampler configured to use the fourth signal to sample the received signal or the output signal to generate a digital sampled signal by analog-to-digital converting, and comprising:
  - a first terminal coupled to the frequency divider to receive the fourth signal;
  - a second terminal coupled to the transceiving node to receive the received signal or the output signal respectively; and
  - an output terminal configured to output the digital sampled signal;
- a digital low pass filter coupled to the output terminal of the sampler, and configured to obtain a low frequency portion of the digital sampled signal so as to generate a filtered signal; and
- a digital signal processor coupled to the digital low pass filter to receive the filtered signal and configured to process the filtered signal to generate the displacement signal.

17. The detector of claim 16, wherein the fourth frequency is greater than twice a bandwidth of the received signal.

18. The detector of claim 16, wherein the fourth frequency is lower than the third frequency or the second frequency.

19. The detector of claim 1, wherein the received signal or the output signal is used to generate a displacement signal corresponding to the displacement of the object.

* * * * *